United States Patent
Hashimoto et al.

[11] Patent Number: 5,846,869
[45] Date of Patent: Dec. 8, 1998

[54] METHOD OF MANUFACTURING SEMICONDUCTOR INTEGRATED CIRCUIT DEVICE

[75] Inventors: Takashi Hashimoto, Ome; Hideo Miura, Koshigaya; Toshiyuki Kikuchi, Ome; Toshiyuki Mine, Fussa; Yoichi Tamaki, Kokubunji; Takahiro Kumauchi, Hamura, all of Japan

[73] Assignee: Hitachi, Ltd., Tokyo, Japan

[21] Appl. No.: 685,844

[22] Filed: Jul. 24, 1996

[30] Foreign Application Priority Data

Aug. 11, 1995 [JP] Japan .................................. 7-205893

[51] Int. Cl.⁶ ............................................... H01L 21/301
[52] U.S. Cl. ...................... 438/365; 438/368; 438/378; 438/745; 438/906
[58] Field of Search .......................... 437/31, 946, 162; 148/DIG. 17, DIG. 123, DIG. 124; 438/365, 368, 378, 745, 906

[56] References Cited

U.S. PATENT DOCUMENTS

| | | | |
|---|---|---|---|
| 5,194,397 | 3/1993 | Cook et al. ................................ | 437/31 |
| 5,270,224 | 12/1993 | Furumusa et al. ............. | 148/DIG. 123 |
| 5,296,388 | 3/1994 | Kameyama et al. ...................... | 437/31 |
| 5,352,636 | 10/1994 | Beinglass ........................ | 148/DIG. 17 |
| 5,380,677 | 1/1995 | Eakin ...................................... | 437/946 |
| 5,387,580 | 2/1995 | Miyasaka .................................. | 437/93 |
| 5,420,050 | 5/1995 | Jerome et al. ............................. | 437/31 |
| 5,420,051 | 5/1995 | Bohr et al. ................................ | 437/31 |

FOREIGN PATENT DOCUMENTS

| | | |
|---|---|---|
| 1-187864 | 7/1989 | Japan . |
| 2-30144 | 1/1990 | Japan . |
| 2-210820 | 8/1990 | Japan . |
| 6-112215 | 4/1994 | Japan . |

OTHER PUBLICATIONS

"Silicon Based HBT: Comparison of Concepts" by Kasper, pp. 868–870 (1994).

"Physics, Technology, and Modeling of Polysilicon Emitter Contacts for VLSI Bipolar Transistors" by Gary L. Patton, et al pp. 1754–1766 (1986).

"Stress–Induced Quasi–Hetero–Emitter Band Structure for a Phosphorus–Doped Poly–Si Emitter Bipolar Transistor" by Masao Kondo, et al pp. 273–275 (1993).

"Effect of $SiO_2$ Surface Treatment on the Solid–Phase Crystallization of Amorphous Silicon Films" by Tetsushi Shimizu pp. 298–302 (1995).

"Effects of surface hydrogen on the air oxidation at room temerature of HF–treated Si(100) surfacess" by N. Hirashita, et al pp. 451–453 (1990).

Primary Examiner—Tuan H. Nguyen
Attorney, Agent, or Firm—Antonelli, Terry, Stout, & Kraus, LLP

[57] ABSTRACT

A method of manufacturing a bipolar transistor having an improved polysilicon emitter is disclosed. More specifically, hydrogen terminations or OH group terminations adhered (bonded) to an emitter-forming region are eliminated by a heat treatment in an inert gas atmosphere before forming emitter polysilicon. Subsequently, an amorphous silicon film for forming an emitter polysilicon is formed at a low temperature.

10 Claims, 22 Drawing Sheets

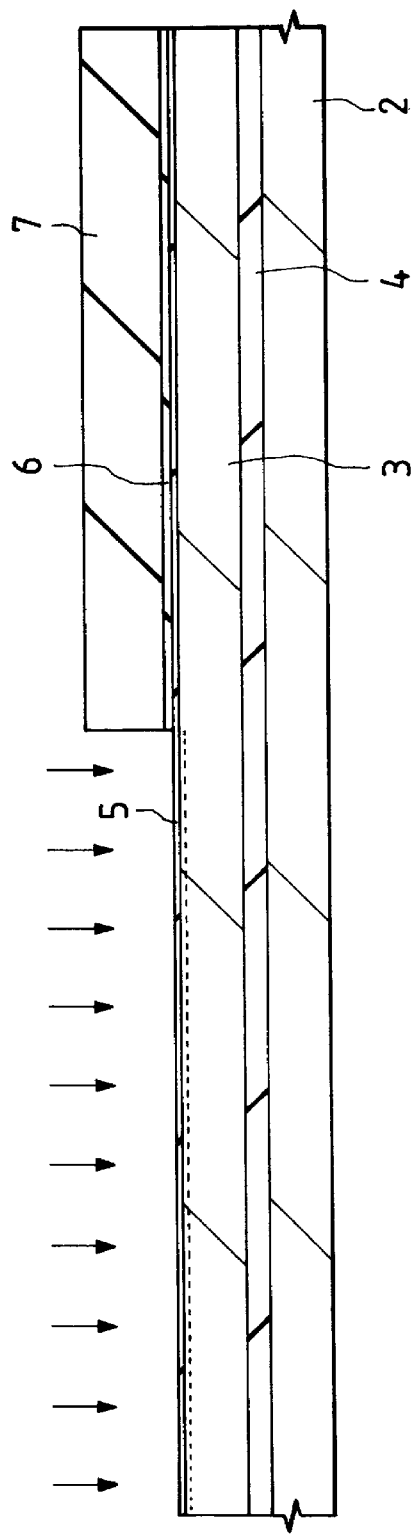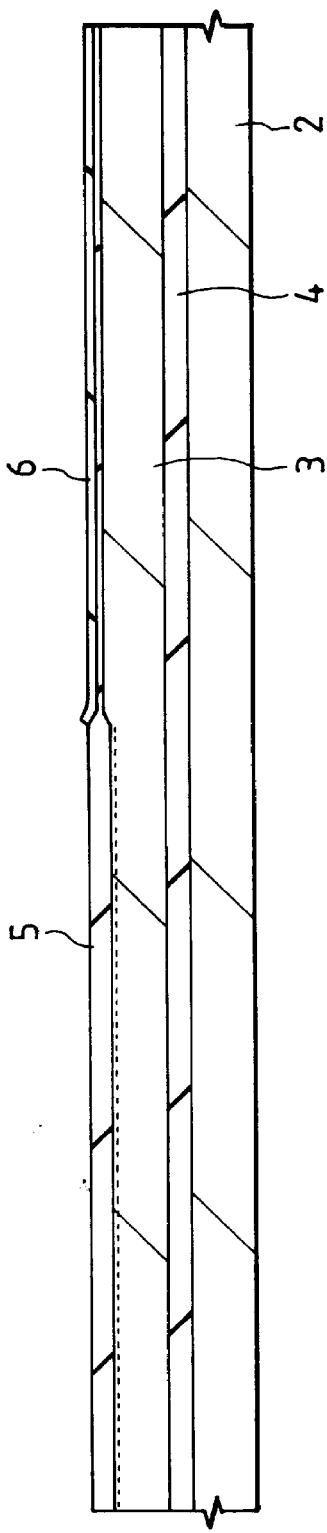

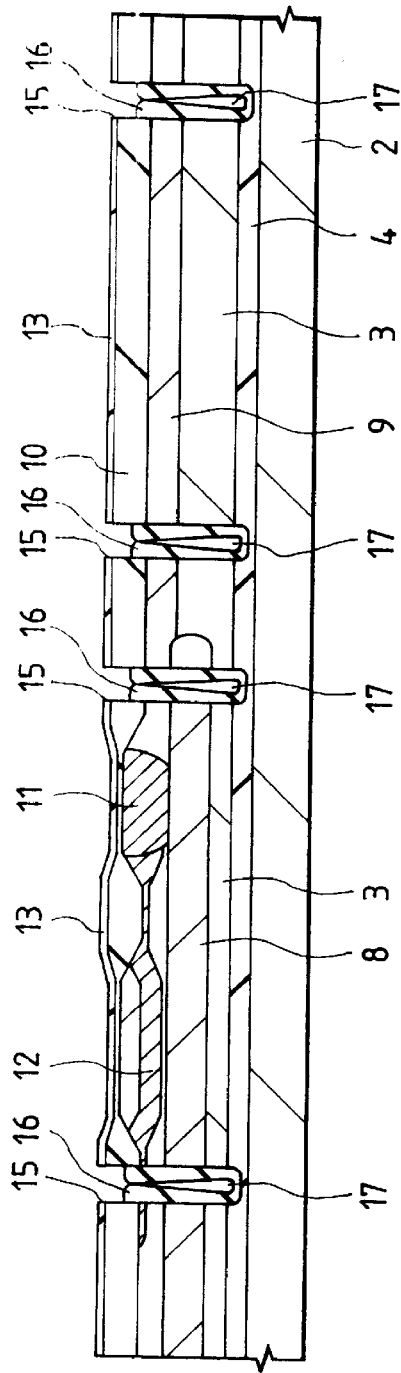
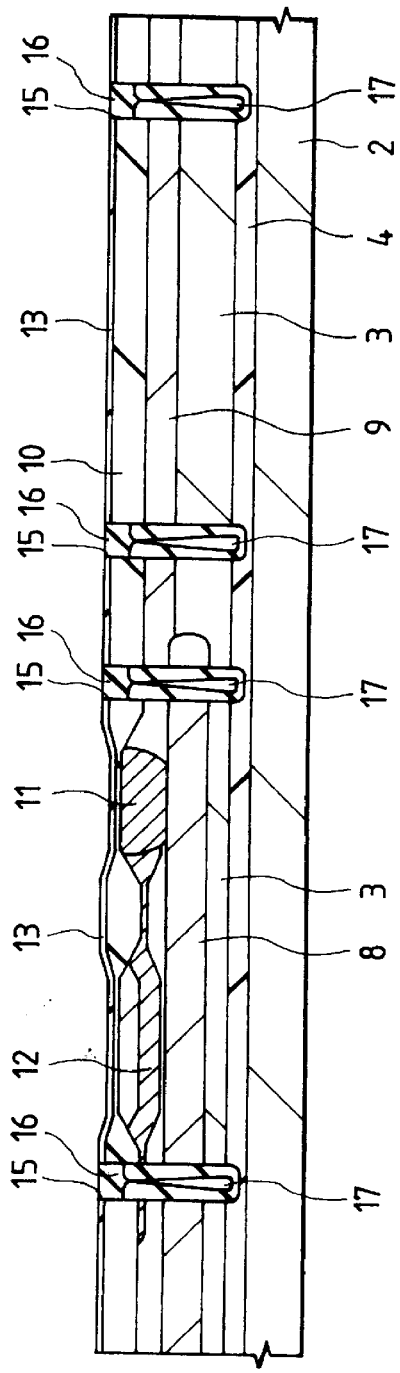

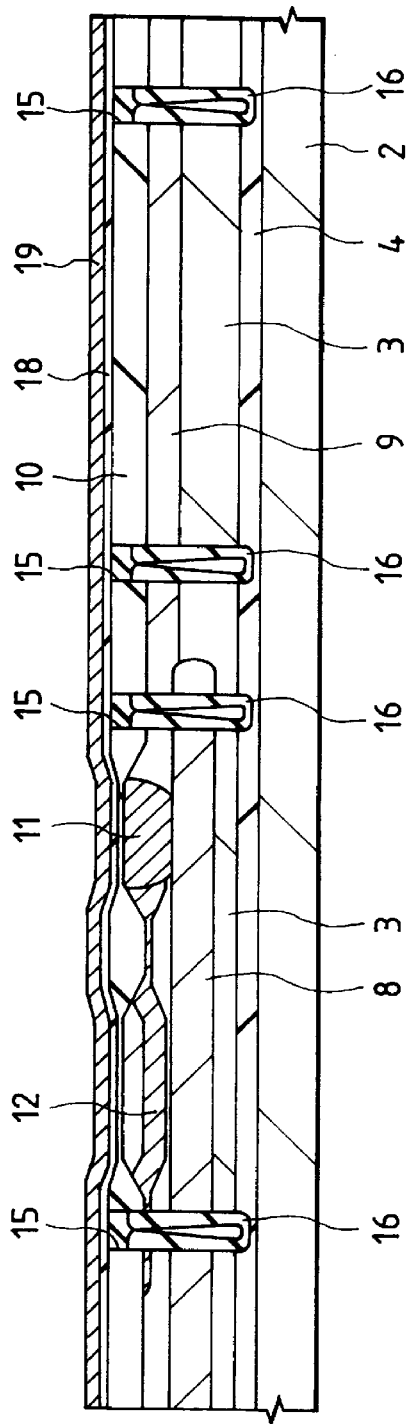
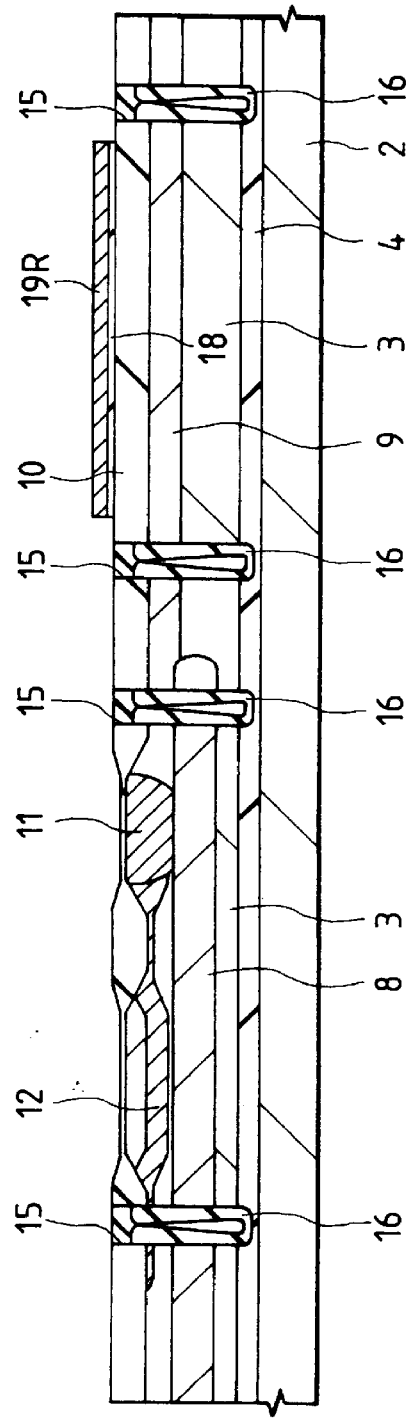

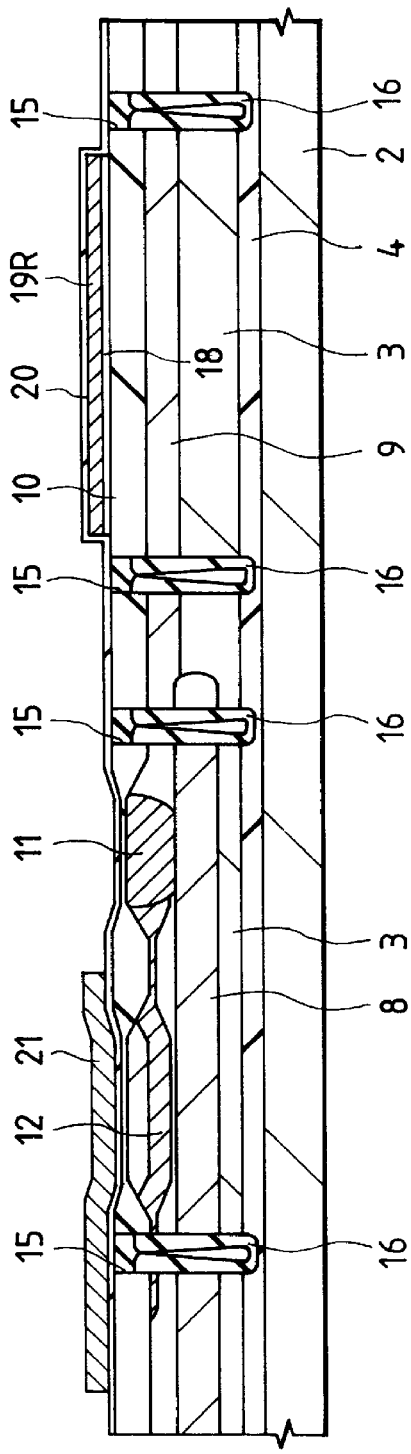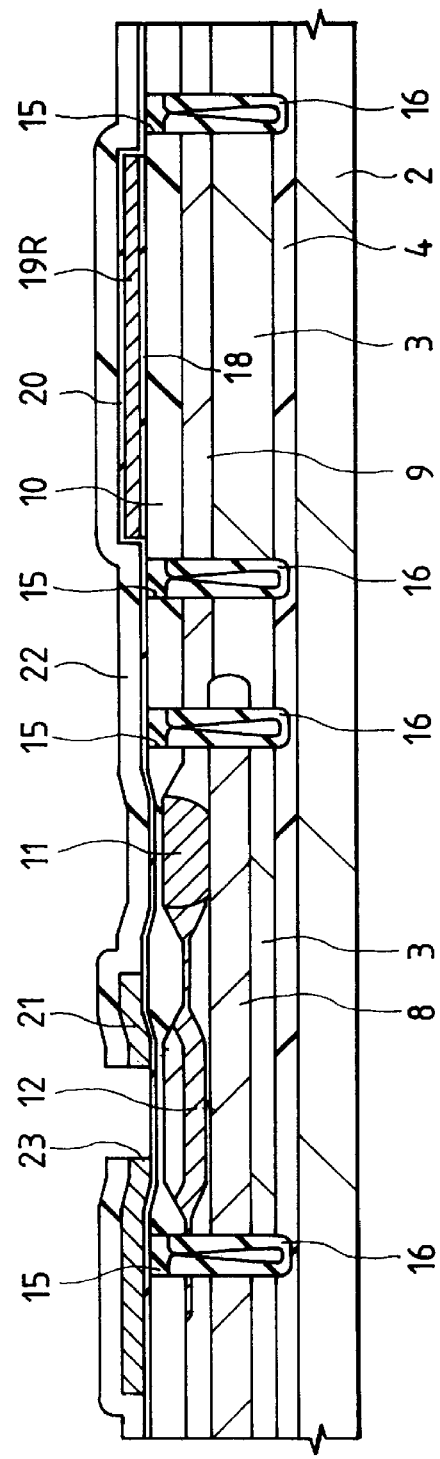

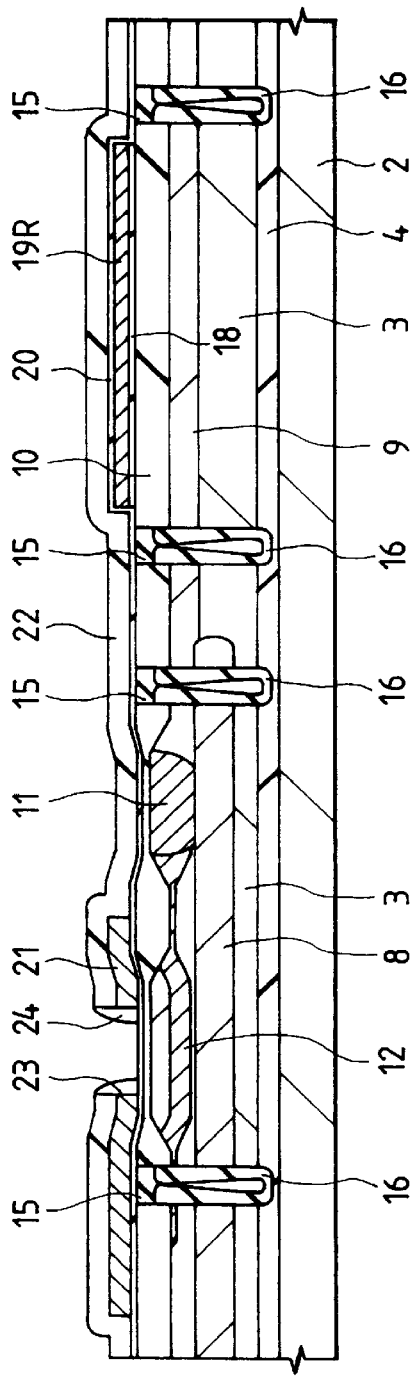
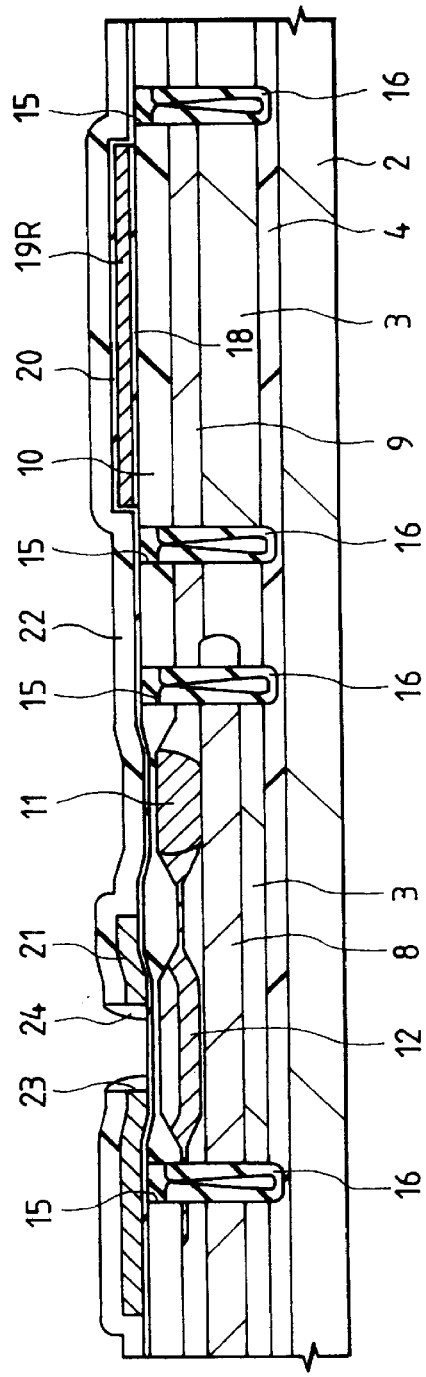

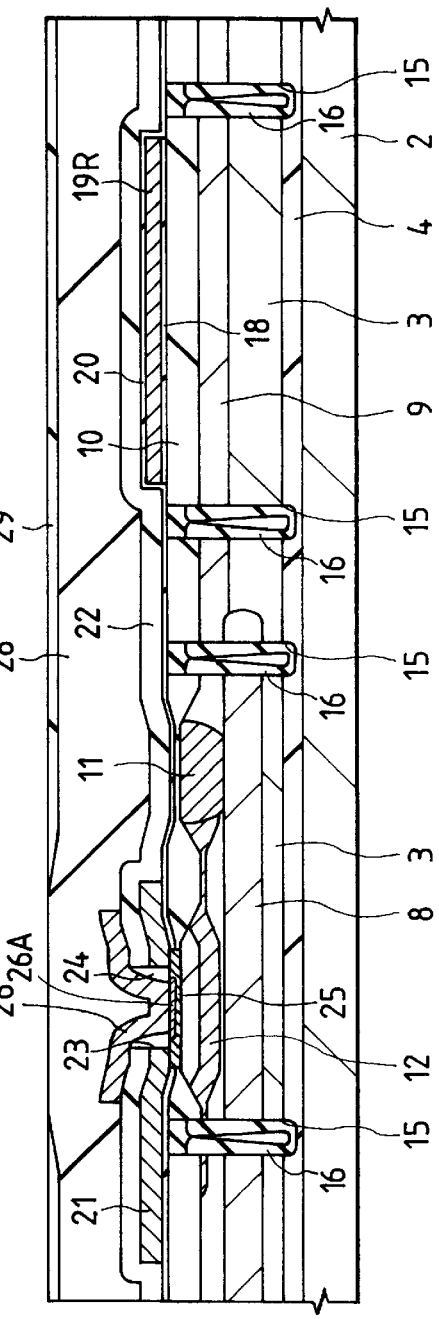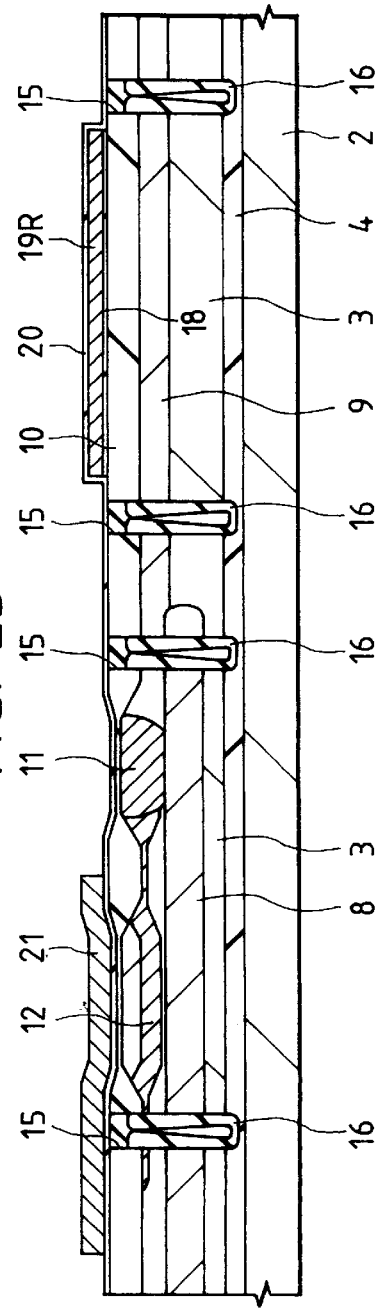

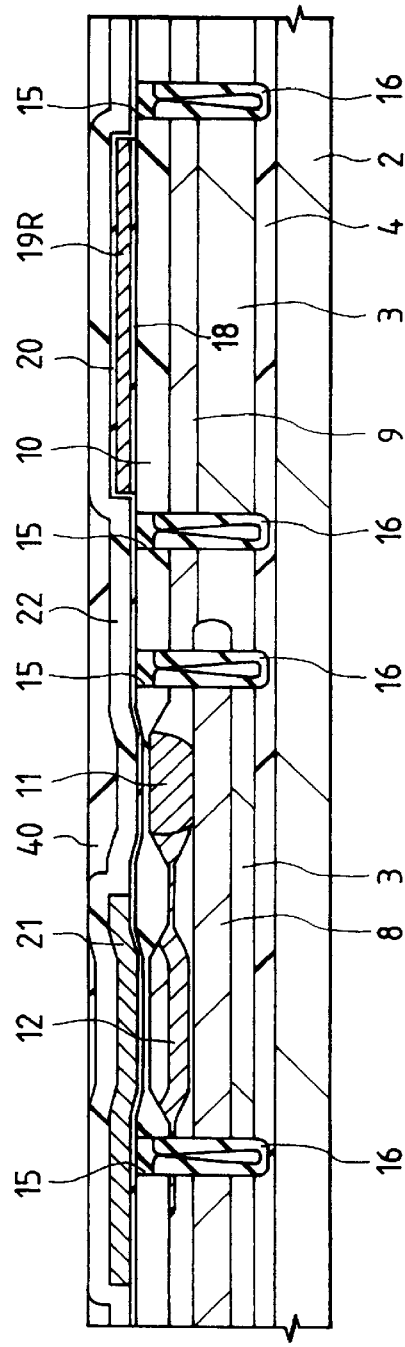
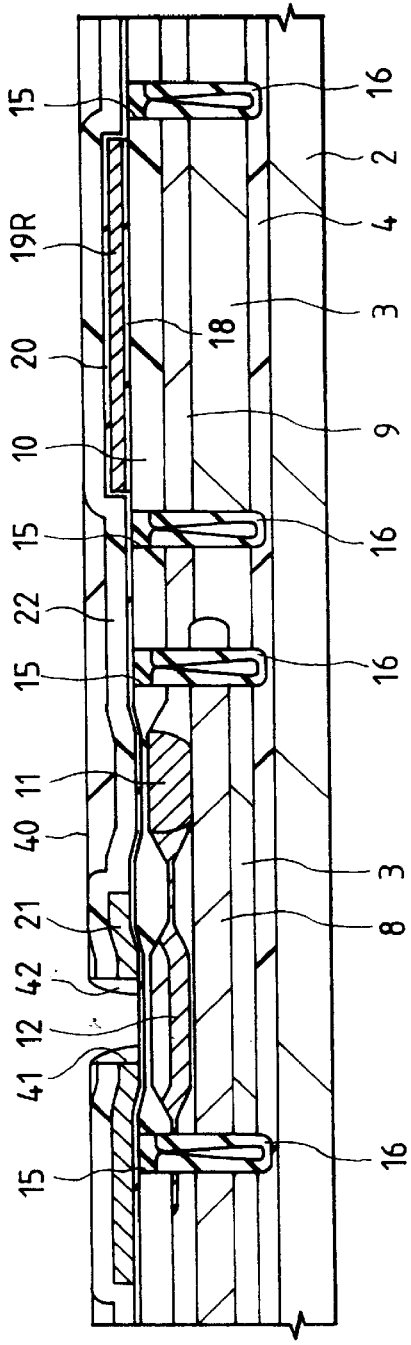

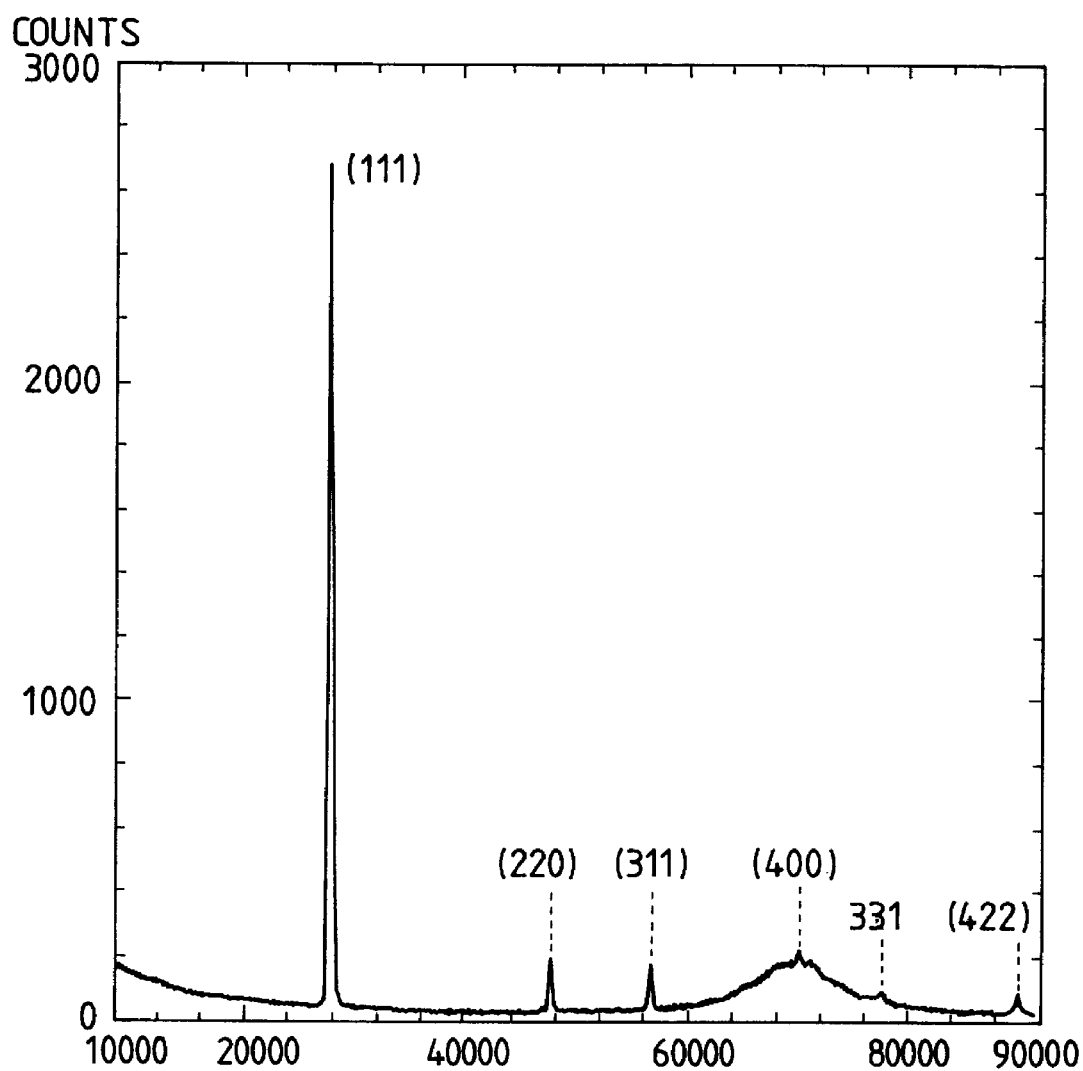

FIG. 27(b)
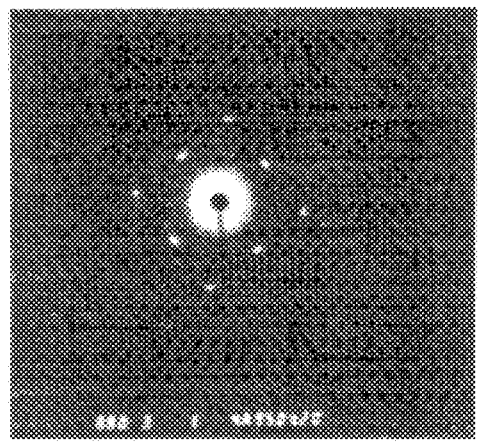
ELECTRON DIFFRACTION
PATTERN 1 OF EMITTER
POLYSILICON
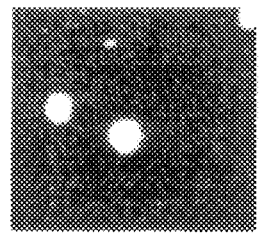
ELECTRON DIFFRACTION
PATTERN 2 OF EMITTER
POLYSILICON COMPARISON OF Si-Hx SPECTRUM BEFORE AND AFTER RTA ($N_2$ FLOW RATE = 3 SLM)

COMPARISON OF Si-O SPECTRUM BEFORE AND AFTER RTA ($N_2$ FLOW RATE=3 SLM)

ANALYSIS FOR THE SURFACE OF Si SUBSTRATE BY FOURIER IR SPECTROMETRY (FTIR)
DEPENDENCE OF Si-O INTENSITY ON OXYGEN CONCENTRATION IN $N_2$ ANNEALING FURNACE

METHOD OF MANUFACTURING SEMICONDUCTOR INTEGRATED CIRCUIT DEVICE

BACKGROUND OF THE INVENTION

The present invention concerns a technique for manufacturing a semiconductor integrated circuit device and, more in particular, it relates to a technique effectively applicable to a semiconductor integrated circuit device having bipolar transistors.

For increasing the operation speed of a bipolar transistor, it is necessary to make an impurity distribution shallower and make a peak impurity concentration higher in a base region for making high operation speed and withstand voltage compatible. However, this results in a problem that leak current and parasitic capacitance are increased between an emitter and a base if the impurity concentration in the base region is increased approximately to the impurity concentration in an emitter region. The problem can be overcome by providing a buffer layer at a low impurity concentration between the emitter and the base and making the buffer layer entirely depleted. However, this countermeasure causes a disadvantage of lowering a current amplification factor (hFE) as a side-effect.

As a method of overcoming the problem that the current amplification factor is lowered by the introduction of the buffer layer, it has been considered to introduce a heterojunction to an emitter-base junction. For example, it is proposed to introduce a SiGe hetero-junction for narrowing a band gap width of the base region in "E. Kasper, 'Silicon Based HBT:Comparison of Concepts' Extended Abstracts of the 1994 International Conference on Solid State Devices and Materials, pp. 868–870".

Further, it has been known as described in "G. L. Patton, et al, IEEE Transaction on Electron Devices, vol. ED-33, P. 1754, 1986", that when a polycrystal silicon film is deposited on a silicon substrate by chemical vapor deposition method (CVD), a spontaneously oxidized film is formed at a boundary between the silicon substrate and the polycrystal silicon film, which gives an effect on transistor characteristics. Japanese Patent Laid-Open No. Hei 2-210820(1990) describes a technique of positively utilizing the principle for increasing the current amplification factor by causing the spontaneously oxidized film at the boundary to function as a hole barrier. This is a device structure referred to as SIPOS (Semi-Insulating Polycrystalline Si) and it is considered that the film thickness of the spontaneously oxidized film is desirably from 1 nm to 2 nm.

It has been reported that the current amplification factor of the bipolar transistor can be increased by using a polycrystal silicon film which is doped with phosphorus in-Situ simultaneously with deposition (IDP: In-Site phosphorus doped polysilicon) as an emitter leading electrode, different from the method described above. As a physical model thereof, it is shown by determining electric characteristics of a pn junction, that stresses are generated at a boundary between a crystal of (111) orientation and a crystal of (100) orientation to fluctuate a band gap in "M. Kondo et al, Stress-Induced Quasi-Hetero-Emitter Band Structure for a Phosphorus-Doped Poly-Si Emitter Bipolar Transistor, Extended Abstracts of the 1993 International Conference on Solid State Devices and Materials; 1993, pp.273–275". If this technique can be utilized, it is possible to attain a heterojunction with no problem of mismatching of crystallinity as in the case of SiGe.

On the other hand, selective epitaxial growing technology has been noted in recent years as a technique for attaining a shallow junction in the base region. By using this technology, a junction which is shallow and has a high peak impurity concentration can be attained with no requirement for consideration on the problem of substrate damages caused by ion injection. In addition to such a merit, since an intrinsic base region can be formed in a self-aligned manner by using this technique, it is possible to reduce the base resistance and reduce the base-collector parasitic capacitance.

Various proposals have been made so far regarding a device structure of a high performance bipolar transistor and a manufacturing method therefor using the selective epitaxial growing technique.

For example, Japanese Patent Laid-Open No. Hei 2-30144(1990) discloses a method of forming an insulation film for emitter-base isolation, then providing an aperture on an active region by wet etching and, subsequently, forming an intrinsic base region in an self-aligned manner by using the selective epitaxial growing technique. The method comprises a step of depositing a silicon oxide film on an n-silicon substrate to form a collector region, a step of depositing a p-polycrystal silicon film to form a base leading electrode on the silicone oxide film, a step of forming an aperture penetrating the p-polycrystal silicon film and the oxide silicon film to expose the silicon substrate, a step of side etching an end of the silicon oxide film exposed in the aperture by a pretreatment to epitaxial growing by conducting heating for the substrate under a hydrogen-containing atmosphere and a step of forming a silicon epitaxial layer having a thickness in contact with the lower surface of the p-type polycrystal silicon film to form a base region on the silicon substrate exposed to the aperture and to the side etched portion.

Japanese Patent Laid-Open No. Hei 1-187864(1989) proposes a process of forming an insulation film for emitter-base isolation after the formation of an intrinsic base region.

Japanese Patent Laid-Open No. Hei 6-112215(1994) proposes a process of forming a silicon oxide film below a base leading electrode upon emitter aperturing by dry etching, selectively forming a polycrystal silicon film at a high impurity concentration below an overhang of the base leading electrode formed by wet etching of the silicon oxide film, oxidizing and then removing a silicon epitaxial layer formed simultaneously on a collector region in the emitter aperture portion, and selectively growing again the silicon epitaxial layer as a base region to the region.

SUMMARY OF THE INVENTION

The present inventors, et al. have made a study for further increasing the operation speed and reducing the leak current of a high speed bipolar transistor and, as a result, have found that the prior arts described above involve the following problems.

At first, compatibility between the reduction of the emitter-base leak current and insurance of the current amplification factor has been studied, in which there is a problem that a current amplification factor with no side-effects can not be ensured stably in the prior art if the peak impurity concentration in the base region is high.

That is, with regard to introduction of SiGe to the base region as mentioned by E. KASPER, et al. described above, although the application of the buffer layer does not cause a problem of tunnel current due to zener breakdown, since leak current due to lattice mismatching increases between the SiGe layer and the Si layer, this can not be a countermeasure for reducing the leak current.

Also in a case of increasing the current amplification factor by utilizing the spontaneously oxidized film at the boundary as in a SIPOS structure shown in Japanese Patent Laid-Open No. Hei 2-210820(1990), a problem such as increase of the leak current is caused by insertion of a crystal mismatched layer in the emitter-base depletion layer. Further, this approach is not practical since this increases the emitter resistance due to the spontaneously oxidized film on the boundary or a side effect such as diffusion of impurities from the polycrystal silicon film for emitter leading electrode.

Introduction of a heterostructure for the emitter-base junction by utilizing stresses generated at the boundary between the polycrystal silicon film and the silicon substrate pointed out by M. Kondo, et al. is excellent in making it compatible for reducing the leak current and ensuring the current amplification factor because of the absence of interlattice misalignment, but it is generally difficult to grow crystal of (111) orientation on a silicon crystal substrate of (100) direction, for which no practical possibility is shown.

Then, the present inventors, et al. have made a study on the formation of an intrinsic base region by a selective epitaxial technique as a technique necessary for attaining a high speed bipolar transistor. This leads to a problem that increase of parasitic components caused by scattering in the process and lowering of withstand voltage mainly caused by the generation of facets upon forming the intrinsic base region selectively can not be solved in the prior art.

That is, in the process as described in Japanese Patent Laid-Open No. Hei 2-30144(1990), it is necessary to make the width of a graft base region narrower than the width of the intrinsic base region, because of the following reasons.

That is, when the film thickness of the intrinsic base region or the film thickness of the silicon oxide film that insulates the base leading electrode and the silicon substrate should scatter and, if a gap is formed between the side wall spacer and the intrinsic base region, an n-type polycrystal silicon film for the emitter leading electrode possibly intrudes to the gap. In this case, scattering of the emitter area is increased to result in increase of the emitter-base parasitic capacitance.

In order to avoid this problem, it is necessary to reduce the thickness of the silicon oxide film that insulates the base leading electrode and the silicon substrate, to less than the film thickness of the intrinsic base region, but this increases the base-collector parasitic capacitance. Further, upon epitaxial growing, since the film thickness of the epitaxial layer is reduced at a boundary relative to the side wall spacer thereby causing facets, the width of the intrinsic base region is locally reduced to bring about lowering of the withstand voltage between the base and the collector.

On the other hand, if formation of the insulation film for emitter-base isolation is conducted after the formation of the intrinsic base region as described in Japanese Patent Laid-Open No. Hei 1-187864(1989), the problem of facets in the epitaxial layer as described above is not caused. Since the intrinsic base region is initially formed, the width is constant for the graft base region and the intrinsic base region. However, since the silicon oxide film and the silicon nitride film for forming the insulation region for isolation have to be deposited by a CVD process after the formation of the intrinsic base region, this causes a problem that boron in the intrinsic base region diffuses into the silicon substrate by heating in a furnace.

Further, in the above-mentioned patent publication, the side wall spacer that insulates the emitter and the base comprises two layers of insulation films in order to prevent the surface of the silicone substrate from being exposed directly to a plasma atmosphere upon forming the side wall spacer. The side wall spacer is formed by etching back the insulation film deposited by the CVD process and by leaving the insulation film on the side wall of the base leading electrode. In this case, since stepped portions such as a resistance element using polycrystal silicon are present on the surface of the substrate, the side wall spacer is formed also on the stepped portion. However, if the stepped portion of the resistor element is lower than the stepped portion of the emitter aperture portion, when the silicon oxide film on the surface of the silicon substrate at the emitter aperture portion is wet etched, the side wall spacer formed to the stepped portion of the resistor element is peeled, which is attributable to the formation of obstacles. It is apparent that the problem may occur also in the step of side etching the end portion of the silicon oxide film exposed in the aperture on the silicon substrate also in Japanese Patent Laid-Open No. Hei 2-30144(1990).

In Japanese Patent Laid-Open No. Hei 6-112215(1994), the silicon nitride film as the insulation film on the base leading electrode is used to avoid formation of the side wall spacer to the stepped portion other than the emitter aperture portion. However, in this structure, the polycrystal silicon film for the emitter leading electrode has to be fabricated on the silicon nitride film. Since the selection ratio between the polycrystal silicon film and the silicon nitride film in dry etching is small, fabrication is difficult. Further, since the silicon nitride film remains over the entire surface, when an interlayer insulation film is deposited after the formation of the device and a connection hole reaching the device is formed, the side wall of the connection hole is formed as a structure of complicate stacked deposition films of different wet etching rates. Therefore, an overhang structure is liable to be formed after wet etching, to deteriorate the coverage of the wiring conductive film in the connection hole. Accordingly, this structure is generally difficult to adopt.

An object of the present invention is to provide a technique capable of reducing a leak current and a parasitic capacitance between an emitter and a base without lowering a current amplification factor of a bipolar transistor.

Another object of the present invention is to provide a technique capable of overcoming the problem of increasing the parasitic component and lowering the withstand voltage caused upon forming an intrinsic base region in a self-aligned manner by using selective epitaxial technique.

A further object of the present invention is to provide a technique capable of manufacturing a bipolar transistor at a high yield for forming an intrinsic base region in a self-aligned manner by using selective epitaxial technique.

The foregoing and other objects, as well as novel features of the present invention will become apparent in view of the descriptions of the specification and the appended drawings.

Outline of typical inventions among those disclosed in the present application will be explained simply as below.

A method of manufacturing a bipolar transistor according to the present invention comprises:

a step of wet cleaning the surface of a semiconductor substrate to form an emitter region of a bipolar transistor, a step of subjecting the semiconductor substrate to a heat treatment at a predetermined temperature thereby eliminating hydrogen terminations or OH group terminations deposited on the surface of an emitter-forming region, a step of depositing an impurity-containing silicon film on the semiconductor substrate including the emitter forming region, and a step of diffusing impurities in the silicon film to the surface of the semiconductor substrate thereby forming an emitter region.

Another method of manufacturing a bipolar transistor according to the present invention comprises:

a step of depositing a second conductive type polycrystal silicon film for a base leading electrode by way of a first insulation film on a first conductive type semiconductor substrate and then depositing a second insulation film on the second conductive type polycrystal silicon film, a step of etching the second insulation film and the second conductive type polycrystal silicon film thereby forming an emitter aperture portion reaching the first insulation film, a step of forming a side wall spacer comprising a third insulation film having an etching rate different from that of the first insulation film to a side wall of the emitter aperture portion, a step of etching the first insulation film at the bottom of the emitter aperture portion to expose the surface of the semiconductor substrate and side etching an end portion of the first etching film, a step of epitaxially growing selectively a semiconductor layer doped with second conductive type impurities to the surface of the semiconductor substrate exposed at the bottom of the emitter aperture portion and then epitaxially growing selectively a buffer layer at an impurity concentration lower than that of the semiconductor layer to the surface of the semiconductor layer, and a step of patterning the first conductive type polycrystal silicon film deposited on the second insulation film including the inside of the emitter aperture portion thereby forming an emitter leading electrode.

A further manufacturing method of the bipolar transistor according to the present invention includes a step of flattening the surface of the second insulating film prior to the step of etching the first insulation film at the bottom of the emitter aperture portion.

According to the means described above, since hydrogen atoms or OH groups adhered (bonded) to the surface of the emitter-forming region by wet cleaning are removed by the subsequent heat treatment, it is possible to deposit the silicon film for forming the emitter electrode in a substantially in a complete amorphous state. Accordingly, when the silicon film is made polycrystalline, the grain size of the polycrystal silicon film can be increased. Accordingly, since the band gap of the emitter can be increased substantially, the current amplification factor of the bipolar transistor can be increased. Further, by subjecting the silicon substrate to the heat treatment just before the deposition of the silicon film and by dissociating the hydrogen terminations and the OH terminations on the surface of the substrate, a silicon film, for example, oriented uniformly in (111) direction can be grown on a silicon substrate of (100) orientation, so that scattering of the current amplification factor of the bipolar transistor can be suppressed, for example, at a level in the wafer or at a level in the chip.

FIG. 26 is a graph showing a correlationship between a current amplification factor and an emitter-base band gap difference of bipolar transistors. The ordinate indicates the amplification factor of the bipolar transistor and the abscissa indicates the emitter-base band gap difference determined from the temperature characteristic of the current amplification factor. As shown in the graph, the current amplification factor and the band gap difference for each of the devices are on one identical line. The gradient is an activation energy (kT/q) at a room temperature upon measurement, showing that the current amplification factor scatters in bipolar transistors utilizing the IDP film for the emitter leading electrode because of the difference between the devices, for example, at the level in the wafer or at the level in the chip. This is because silicon for the emitter electrode deposited on the silicon substrate does not orient to a constant direction after annealing and, therefore, stresses concentrated at the boundary are scattered. The graph shows that the band gap emitter is wider as the stresses concentrated to the boundary is greater.

FIG. 27 shows a result of measurement for crystal orientation after depositing amorphous silicon on a silicon substrate by a CVD process and increasing the grain size by a heat treatment. FIG. 27(a) is a graph obtained by measuring the orientation of the polycrystal silicon film on a silicon oxide film by X-ray spectral analysis, while FIG. 27(b) is a photograph showing an electron diffraction pattern for TEM samples of IDP films which are made polycrystalline on a silicon substrate of (100) orientation. Usually, an amorphous silicon film tends to orient along (111) on a silicon oxide film while tends to orient along (100) on a silicon substrate identical with the surface of the substrate. However, as shown in FIG. 27(a), it is partially oriented along (111) also on the silicon substrate. Referring closer to the electronic diffraction pattern, as shown in FIG. 27(b), the crystal orientation is different depending on positions and it is known that the crystal orientation has a close relation with device characteristic.

This problem can be solved by controlling the surface state of the silicon substrate. FIG. 28 shows a result of observation by a beam microscope for the growth of crystal grains on the silicon oxide film and on the silicon substrate. The photograph shows the result of observation for grains crystallized by a heat treatment at 590° C. for 30 min, in which spot-like area shows grain and the periphery thereof is an amorphous film. FIG. 28(a) shows the grain on the silicon substrate, FIG. 28(b) shows that on a thermally oxidized film and FIG. 27(c) shows that on a chemical oxide film of about 1.2 nm thick. From the figures, it can be seen that the growth of crystal grains is faster on the silicon substrate film compared with that on the silicon substrate. This is because nucleation occurs from the boundary between the silicon oxide film and the silicon substrate.

Further, it has also been known that Si—H bonds have a function of suppressing the moving distance on the surface of Si atoms and reducing nucleation rate (T. Shimizu, et al., Effect of $SiO_2$ Surface Treatment on the Solid-Phase Crystallization of Amorphous Silicon Films, J. Electrochem. Soc., Vol. 142, No. 1, January 1995). The surface of the silicon substrate is cleaned by aqueous hydrogen fluoride before deposition of amorphous silicon, in which the surface of the silicon substrate is terminated with hydrogen atoms. Subsequently, the hydrogen terminations dissociate partially from the surface of the substrate by a heat treatment at a temperature from 450° C. to 550° C. in a CVD furnace for depositing the IDP film, thereby partially suppressing the growth of the spontaneously oxidized film and increasing scattering of the film thickness. Further, it also scatters the nucleation rate to worsen the orientation property of the crystal orientation.

It has been known that when a heat treatment is applied at about 650° C. as a method of removing hydrogen terminations from the surface of the substrate, the hydrogen atoms are completely dissociated from the surface (N. Hirashita, et al., Effects of surface hydrogen on the air oxidation at room temperature of HF-treated Si (111) surfaces, Appl. Phys. Lett. 56(5), 29 January 1990).

FIG. 29 to FIG. 31 show the result of measurement by IR spectrometry (ATR–FTIR) made by the present inventors, et. al. The hydrogen terminations were dissociated by a heat treatment at 650° C. for 20 sec. Since the temperature is as low as 650° C., the intrinsic base region formed previously does not diffuse into the substrate and, accordingly, the high speed operation property of the device is not deteriorated. Further, after the dissociation of the hydrogen terminations, Si—O bonds are uniformly formed on the silicon substrate. In this case, growth of the silicon oxide film that gives an effect on the emitter resistance does not occur unless it is in a so-called oxidizing atmosphere at a temperature higher than 800° C. That is, when the hydrogen terminations are dissociated at about 650° C. after cleaning the substrate and the substrate is inserted into a CVD furnace at about 540° C., a Si—O single layer bond is formed on the surface of the substrate with residual oxygen at about 10 ppm in the CVD furnace.

The temperature for the heat treatment is preferably about 650° C. for dissociating the hydrogen terminations from the surface of the substrate, and the hydrogen terminations can be dissociated at a temperature of about 550° to 650° C. which is higher than the temperature in the CVD furnace since the hydrogen terminations tend to dissociate more easily in an exponential manner relative to the temperature.

FIG. 32 shows the difference of characteristics between cases of removing and not removing the hydrogen terminations. It can be seen that scattering is remarkable in a case where the hydrogen terminations are not removed, whereas the band gap difference is stabilized and the scattering of the current amplification factor is also reduced, when the hydrogen termination are removed. The characteristic line itself tends to be entirely in a region of higher current amplification factor, because of the effect of increased thickness of the oxide film at the boundary. As apparent from the figure, increase of the current amplification factor by unifying the band gap difference is more predominant. By dissociating the hydrogen terminations on the surface, the surface diffusion length of Si atoms is increased and nucleation is formed on the surface of the substrate at an initial stage for the deposition of amorphous. This causes crystallization also to the amorphous film on the silicon substrate from nucleation at the boundary in the same manner as the amorphous film on the silicon oxide film and polycrystal grains aligned along the crystal orientation (111) is attained, so that the current amplification factor can be increased.

FIG. 32 also shows the characteristic in a case of utilizing a chemical oxide film. While scattering is reduced and the current amplification factor is also increased entirely, the emitter resistance in this case is increased, by about 2 to 10 times as a standard. It is apparent also from the foregoings that the side-effect is large in the prior art. The feature of the present invention resides in utilizing the oxide film on the boundary not as a barrier for minor carriers but as a buffer layer for aligning the orientation of crystal grains of the amorphous silicon to (111) face.

Further, since the facets are formed in the buffer layer by epitaxially growing selectively a semiconductor layer doped with second conductive type impurities to the surface of the semiconductor substrate exposed at the bottom of the emitter aperture portion and then epitaxially growing selectively the buffer layer having an impurity concentration lower than that of the semiconductor layer to the surface of the semiconductor layer, the width of the semiconductor layer constituting the intrinsic base layer is not narrowed. Accordingly, lowering of the withstand voltage of the intrinsic base layer can be prevented. Further, since the thickness of the buffer layer is reduced only at an extreme periphery thereof, the effect of reducing the emitter-base parasitic capacitance is not deteriorated by the insertion of the buffer layer.

Further, since the stepped portion in the region other than the emitter aperture portion is removed by flattening the surface of the second insulating film prior to the step of etching the first insulation film at the bottom of the emitter aperture portion, no side wall spacer is formed to the region other than the emitter aperture portion when the side wall spacer is formed on the side wall of the emitter aperture portion. Accordingly, when the silicon oxide film on the surface of the silicon substrate is wet etched, the side wall spacer is not peeled off in the region other than the emitter aperture portion.

BRIEF DESCRIPTION OF THE DRAWINGS

FIGS. 1 to 22 are cross sectional fragmentary views showing a method of manufacturing a semiconductor integrated circuit device in the order of fabrication steps as a preferred embodiment according to the present invention;

FIGS. 23 to 25 are cross sectional fragmentary views showing a method of manufacturing a semiconductor integrated circuit device in the order of fabrication steps as another preferred embodiment according to the present invention;

FIG. 27(a) is a graph showing the result of measurement of crystal orientation after depositing amorphous silicon on a silicon substrate by a CVD process and increasing the grain size by a heat treatment and FIG. 27(b) is a photograph showing an electron diffraction pattern of TEM samples of IDP films that are made polycrystalline on a silicon substrate of (100) orientation;

FIG. 28 shows results of observation by a beam microscope for growing of crystal grains on a silicon oxide film and on a silicon substrate, in which

DESCRIPTION OF THE PREFERRED EMBODIMENTS

Figure 1:
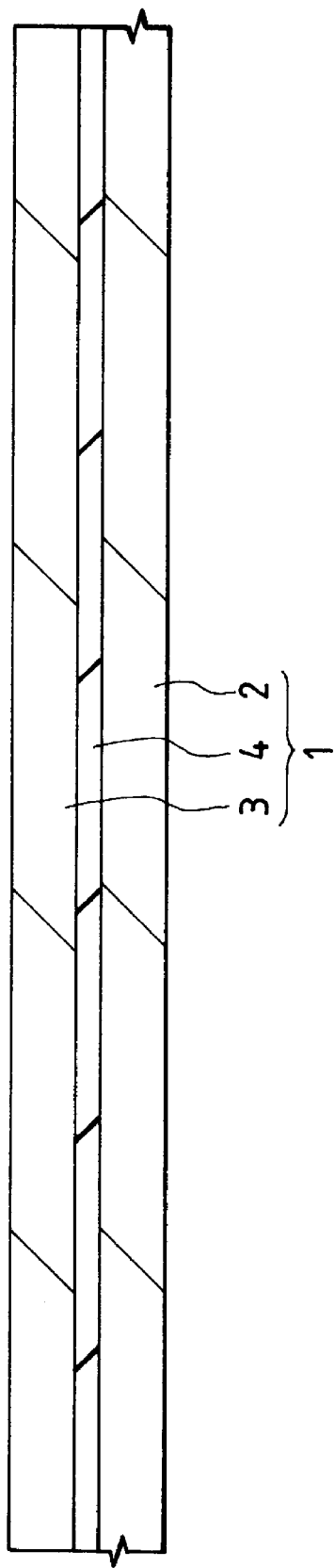

The present invention is to be described in details by way of preferred embodiments with reference to the drawings. Throughout the figures for explaining the preferred embodiments, those having the same functions carry the identical reference numerals, for which repeated explanation will be omitted.

EXAMPLE 1

A method of manufacturing a bipolar transistor using selective epitaxial growing technique according to this embodiment is to be explained with reference to FIG. 1 to FIG. 22.

At first a SOI (Silicon On Insulation) substrate 1 as shown in FIG. 1 is prepared. The SOI substrate 1 comprises a support substrate 2 made of single crystal silicon, an active silicon layer 3 also made of single crystal silicon and a silicon oxide layer 4 for mechanically combining and electrically insulating them.

Figure 2:
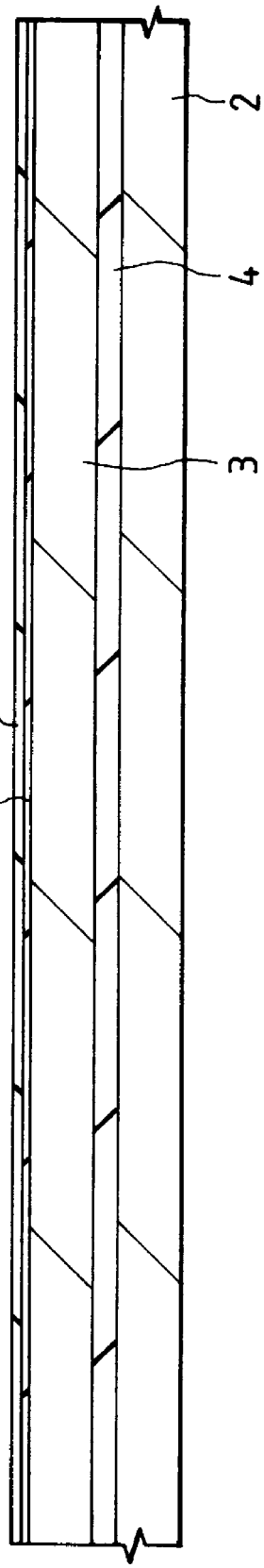

Then, as shown in FIG. 2, after thermally oxidizing the surface of the active silicon layer 3 to form a silicon oxide film 5 of about 10 nm thick, a silicon nitride film 6 is deposited on the silicon oxide film 5 by a CVD process. Then, as shown in FIG. 3, after removing a portion of the silicon nitride film 6 by anisotropic etching using a photoresist 7 as a mask, n-type impurities (phosphorus or arsenic) are ion implanted into the active silicon layer 3 by using the photoresist 7 and the silicon nitride film 6 as a mask. The dose of the n-type impurities is about $1 \times 10^{19}$ cm$^{-3}$.

Figure 5:
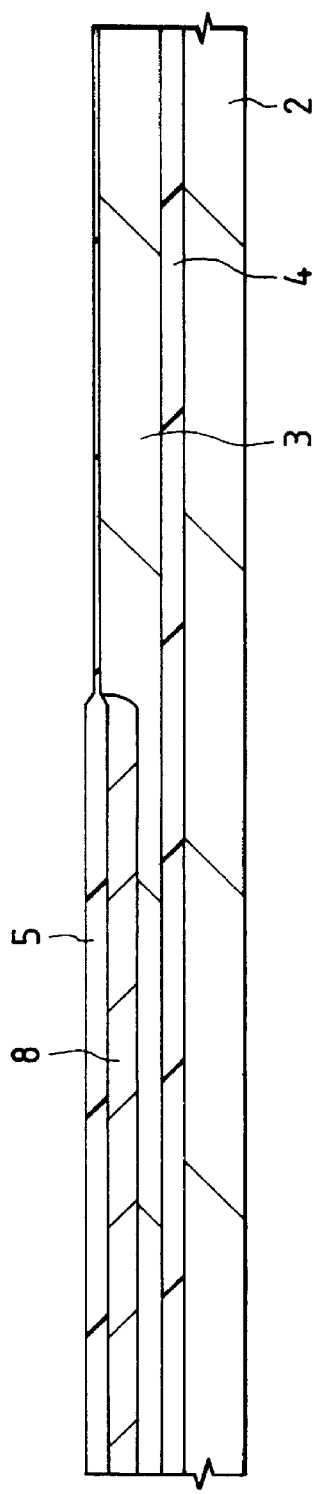

Then, after removing the photoresist 7, as shown in FIG. 4, the surface of the active silicon layer 3 is thermally oxidized to thicken the silicon oxide film 5 in a region in which n-type impurities are ion-implanted. Successively, after removing the silicon nitride film 6 by etching, as shown in FIG. 5, n-type impurities are diffused by a heat treatment at 1100° C. for about 30 min, to form an n-type buried layer 8 in the active silicon layer 3. The depth of the n-type buried layer 8 is about 0.6 μm.

Figure 6:
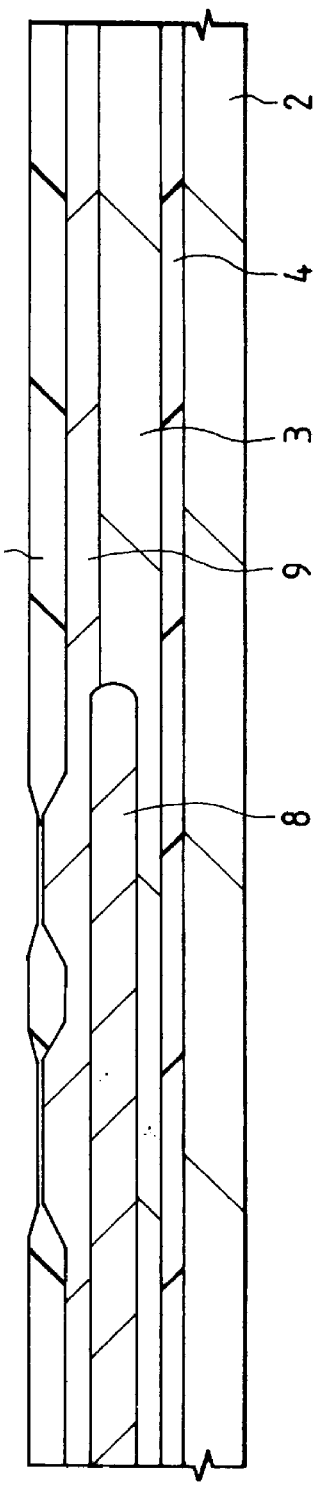

Then, after removing the silicon oxide film 5 on the surface of the active silicon layer 3 by etching, as shown in FIG. 6, an epitaxial layer 9 of N-single crystal silicon is grown above the active silicon layer 3 and, successively, a field oxide film 10 for device isolation is formed on the surface of the epitaxial layer 9 by a thermal oxidation (LOCOS) method. The thickness of the epitaxial layer 9 is about 0.4 μm, and the thickness of the field oxide film is about 400 nm.

Figure 7:
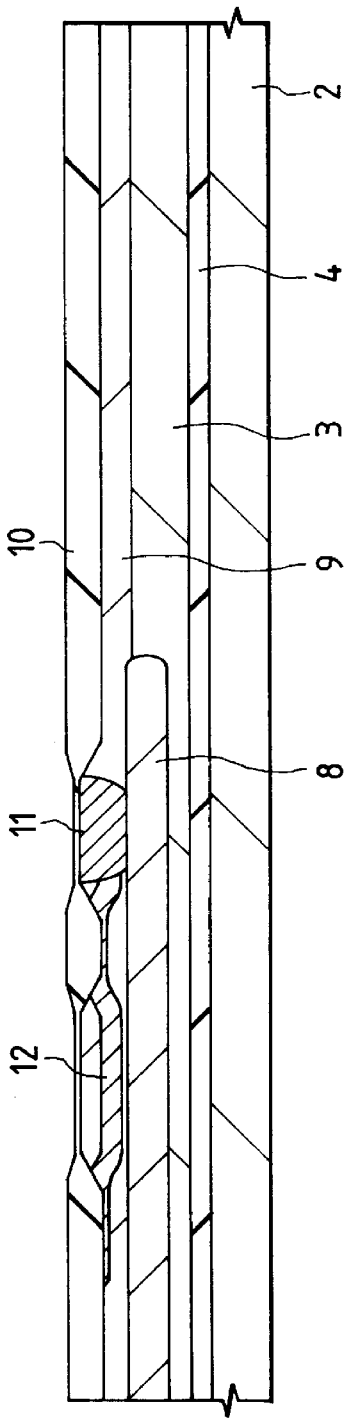

Then, as shown in FIG. 7, a collector leading region 11 and a subcollector region 12 of a bipolar transistor are formed to the epitaxial layer 9. The sub-collector region 12 is formed for reducing the collector resistance to increase the operation speed of the bipolar transistor. The collector leading region 11 is formed by ion implantation of n-type impurities (phosphorus) into the epitaxial layer 9 using, as a mask, a photoresist for exposing a bipolar-forming region (not illustrated). The concentration of the n-type impurities at the surface is about $1 \times 10^{16}$ cm$^{-2}$, and the acceleration energy is about 80 KeV. The sub-collector region 12 is formed by ion implantation of n-type impurities (phosphorus) into the epitaxial layer 9 using the photoresist as a mask. The concentration of the n-type impurities at the surface is about $1 \times 10^{13}$ cm$^{-2}$, and the acceleration energy is at such a level of about 500 KeV as passing through the field oxide film. Subsequently, the photoresist is removed, and damages of the epitaxial layer 9 caused by ion implantation are recovered by a heat treatment at 950° C. for about 10 min.

Figure 8:
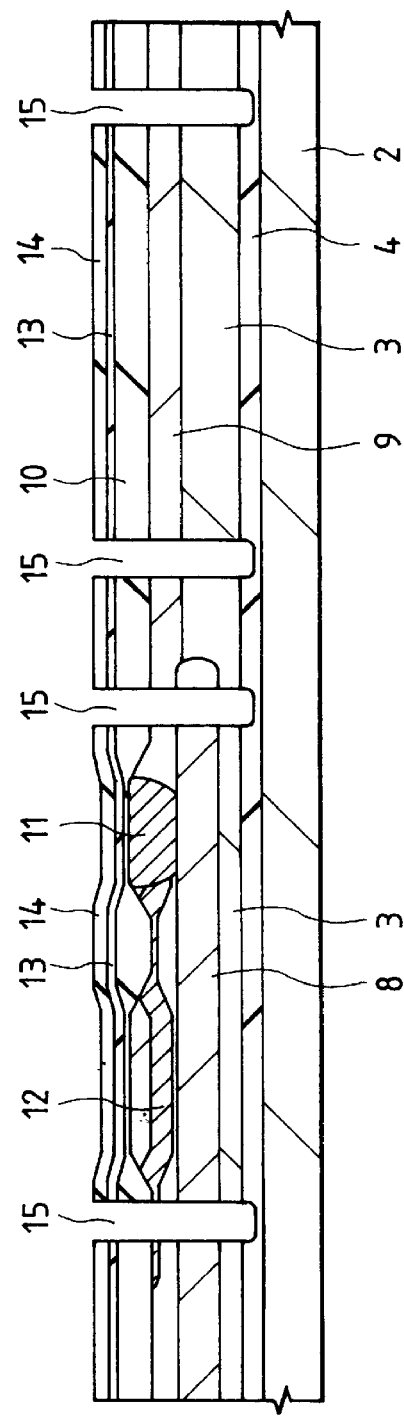

Then, as shown in FIG. 8, after depositing a silicon nitride film 13 and a PSG (phosphosilicate glass) film 14 to about 100 nm and about 200 nm thick, respectively, by a CVD process successively, the PSG film 14, the silicon nitride film 13, the field oxide film 10 and the epitaxial film 9 are etched to form a U-shaped groove 15 reaching the silicon oxide layer 4. The PSG film 14, the silicon nitride film 13 and the field oxide film 10 are etched by a reactive ion etching (RIE) method using a fluorine gas and using a photoresist as a mask. Then, the photoresist is removed, and the epitaxial layer 9 and the silicon oxide layer 4 are etched by a reactive ion etching method using the PSG film 14 as a mask and using chlorine gas or HBr gas.

Then, a silicon oxide film 16 is buried to the inside of the U-shaped groove 15. The silicon oxide film 16 is buried by two separate steps. At first, the silicon oxide film 16 of about 500 nm thick is deposited on the PHG film 16 including the inside of the groove 15 by a CVD process, and the silicon oxide film 16 is etched back. In this case, as shown in FIG. 9, silicon oxide is over-etched till the surface of the silicon oxide film 16 retracts to a position lower than the opening of the U-shaped groove 15. While the PSG film 14 is also etched simultaneously by the overetching, since the underlying silicon nitride film 13 functions as an etching stopper, neither the field oxide film 10 nor the substrate is etched. When the silicon oxide film 16 is over-etched to a position lower than the opening of the groove 15, a void 17 formed to the inside of the U-shaped groove 15 upon deposition of the silicon oxide film 18 also retracts to a position deeper than the opening of the groove 15. Then, a silicon oxide film 16 of about 1,000 nm thick is deposited once again and, as shown in FIG. 10, etched back till the surface of the silicon oxide film 16 in the groove 15 reaches substantially the same height as the opening of the groove 15.

Then, after removing the silicon nitride film 13 by wet etching, as shown in FIG. 11, a silicon oxide film 18 of about 50 nm thick, and a polycrystal film 19 of about 200 nm thick are successively deposited by a CVD process. The polycrystal silicon film 19 is doped with boron during or after the deposition to convert the conductive type into p-type.

Then, as shown in FIG. 12, the polycrystal silicon film 19 is patterned by etching using a photoresist as a mask, to form a resistance element 19R on a field oxide film 10 in a region in which the n-type buried layer 8 is not formed. Generally, when an electric signal flows through a resistor element formed on a semiconductor substrate, an electric field is generated at the periphery of the resistor element, and current flows also in the substrate. Accordingly, this causes energy loss and signal transmitted in the resistance is delayed undergoing the effect of the substrate. In this embodiment, since the n-type buried layer 8 does not situate just below the resistor element 19R, resistance of the substrate is high and, accordingly, the substrate effect can be reduced.

As shown in FIG. 13, after depositing a silicon oxide film 20 of about 50 nm thick by a CVD process, a polycrystal silicon film of about 200 nm deposited by a CVD process on the silicon oxide film 20 is patterned to form the base leading electrode 21 of a bipolar transistor. The silicon oxide film 20 is deposited by using electrode an organic silane gas at a temperature of about 700° C. Further, boron is doped by ion implantation to the polycrystal silicon film to make the conductive type into p-type. The concentration of boron at the surface is about $1 \times 10^{16} \text{cm}^{-2}$ and the acceleration energy is at about 15 KeV.

Then, as shown in FIG. 14, after depositing a silicon oxide film 22 of about 200 nm thick by a CVD process, the silicon oxide film 22 and the underlying base leading electrode 21 are etched to form an aperture portion 23. The silicon oxide film 22 is deposited by using an inorganic silane gas at a temperature of about 800° C. Successively, as shown in FIG. 15, a side wall spacer 24 is formed on the side wall of the aperture portion 23. The side wall spacer 24 is formed by depositing a silicon nitride of about 100 nm thick by a CVD process and then fabricating the silicon nitride film by a reactive ion etching process. In this case, since the silicon film 20 functions as an etching stopper, the substrate (epitaxial layer 9) is not exposed to the bottom of the aperture portion 23.

Then, as shown in FIG. 16, the silicon oxide film 20 exposed to the bottom of the aperture portion 23 is wet etched. In this case, since the silicon oxide film 20 is etched also in the lateral direction, a portion of the base leading electrode 21 is exposed to the bottom of the aperture portion 23. When the silicon oxide film 20 is wet etched, the silicon oxide film 22 is etched simultaneously. However, since the deposition condition (temperature) is different between the silicon oxide film 20 and the silicon oxide film 22, a difference of about twice is caused in the etching rate. Therefor, the amount of etching of the silicon oxide film 22 is kept to about 0.1 $\mu$m during lateral etching for the silicon oxide film 20 by about 0.2 $\mu$m.

Figure 17:
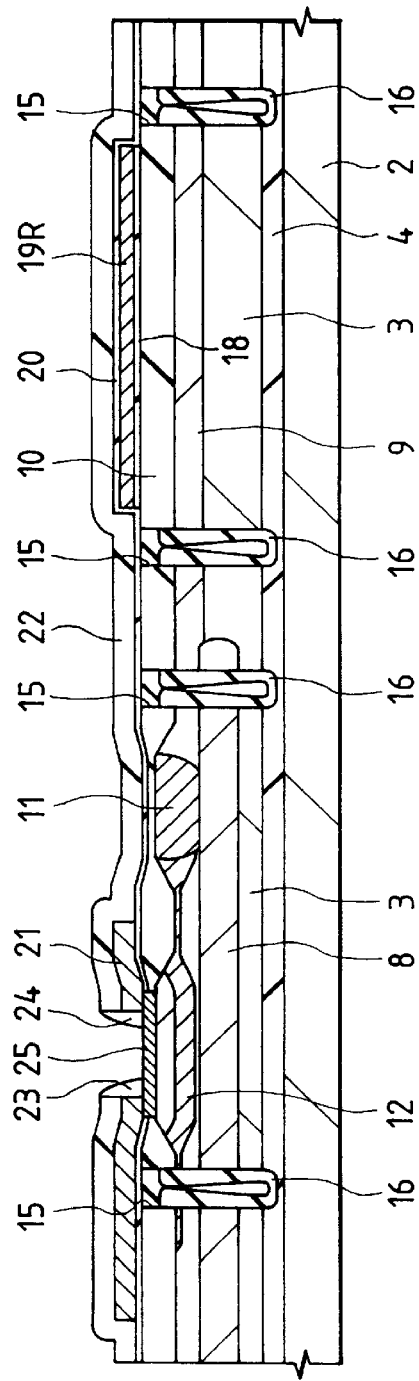

Then, as shown in FIG. 17, a boron-doped silicon layer is epitaxially grown selectively to the surface of the substrate (epitaxial layer 9) exposed to the bottom of the aperture portion 23 thereby forming a base layer 25 in an self-aligned manner. Since a portion of the base leading electrode 21 is exposed to the bottom of the aperture portion 23, the end portion (graft base region) of the base layer 25 is electrically connected with the base leading electrode 21.

Figure 18:
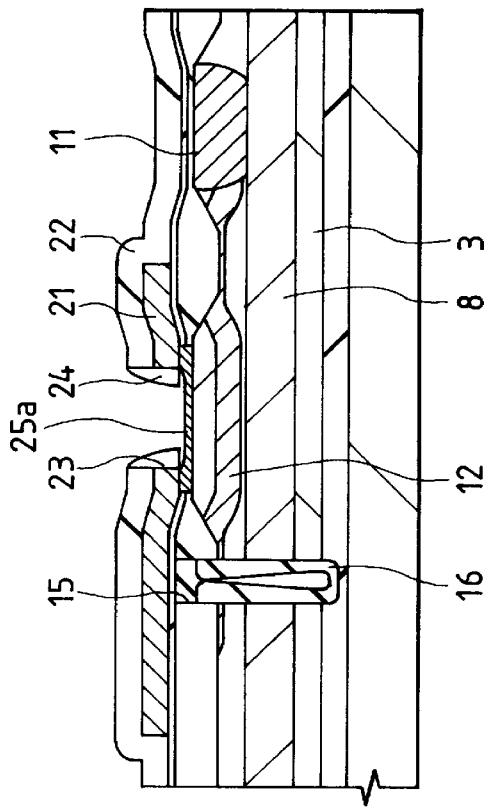
Figure 19:
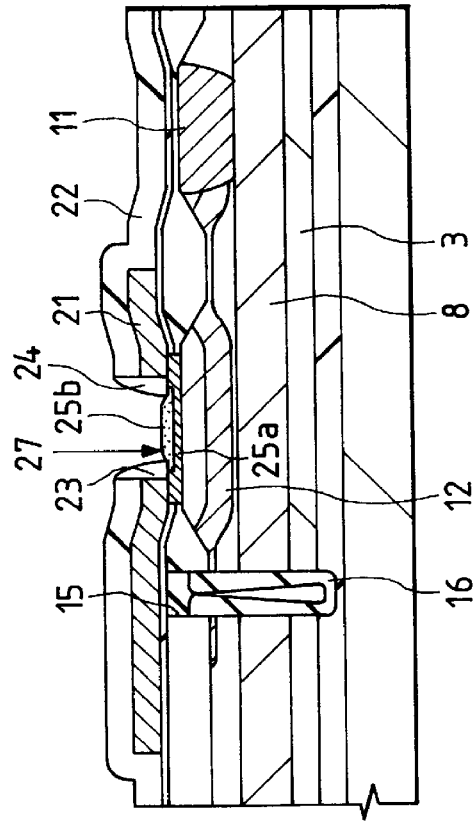

When the base layer 25 is formed, as shown in FIG. 18, an intrinsic base layer 25a of about 25 nm thick is epitaxially grown selectively on the surface of the substrate and, successively, as shown in FIG. 19, a buffer layer 25b of about 15 nm thick is epitaxially grown selectively to the surface of the intrinsic base layer 25. Boron is doped by about $3 \times 10^{19}$ cm$^{-3}$ to the intrinsic base layer 25a, while boron is doped by about $2 \times 10^{17}$ cm$^{-3}$ to the buffer layer 25.

In this case, the thickness of the silicon oxide film 20 is made greater than the thickness of the intrinsic base layer 25a, and less than the thickness for the total of the base layer 25a and the buffer layer 25b. Then, as shown in FIG. 19, since the facet 27 is formed in the buffer layer 25b, the width of the intrinsic base layer 25a itself is not narrowed. Accordingly, lowering of the withstand voltage of the intrinsic base layer 25a can be prevented. Further, since the thickness of the buffer layer 25b is reduced only at the extreme periphery thereof, the effect of reducing the emitter-base parasitic capacitance is not deteriorated by the insertion of the buffer layer 25b.

Then, after cleaning the surface of the base layer 25 by wet etching (for example, by aqueous hydrogen fluoride etching) and rinsing with purified water, infrared heating at 550° C. to 650° C. is applied by using a RTA (Rapid Thermal Annealing) device to eliminate hydrogen terminations and/or OH group terminations adhered (bonded) to the surface of the base layer 25. Thus, a uniform spontaneously oxidized film can be formed at a low temperature on the surface of an emitter forming region in the RAT device or in the CVD device for depositing the polycrystal silicon film for the emitter leading electrode in the subsequent step.

Heating by RTA is applied at a temperature of 550° C. to 650° C., because it has been experimentally confirmed that elimination of the hydrogen terminations is completed substantially at 550° C. to 650° C.

In the figure, solid line A indicates the amount of hydrogen as the actually measured value in the chamber when the wafers is heat treated by the RTA device, while solid line B indicates the amount of hydrogen present initially in the RTA device. Accordingly, it is considered that the hydrogen terminations are completely dissociated at a point at which the amount of hydrogen overlaps with the solid line B (550° C. to 650° C.).

Then, an amorphous film of about 200 nm thick is deposited on the entire surface of the SOI substrate including the emitter-forming region. The amorphous silicon film is formed at a low temperature of about 540° C. or lower by using a gas mixture of SiH$_4$ and PH$_3$ as the raw material gas. The doping amount of phosphorous is, for example, about at $4 \times 10^{20}$ cm$^{-3}$.

Since the hydrogen terminations in the emitter-forming region are eliminated by RTA, the emitter-forming region is in a state of exposing dangling bonds to suppress fine crystallization.

Further, crystallization is taken place during deposition of silicon by using a CVD process at a low temperature of 540° C. Accordingly, it is possible to form a silicon film in a substantially complete amorphous state.

By forming the substantially complete amorphous silicone substrate, it is possible to convert the amorphous silicon film to a polycrystal silicon film of a large grain size by subsequently applying a heat treatment at a high temperature (about 750°–900° C.). Thus, the amplification factor of the bipolar transistor can be improved and stabilized.

Then, the amorphous silicon film deposited as described above is made polycrystalline by a heat treatment, for example, about at 750°–900° C. for 10 min, to form a polycrystal silicon film 26. This heat treatment diffuses phosphorus as n-impurities in the silicon film 26 to the base layer 25, to form an emitter region 26A.

Figure 20:
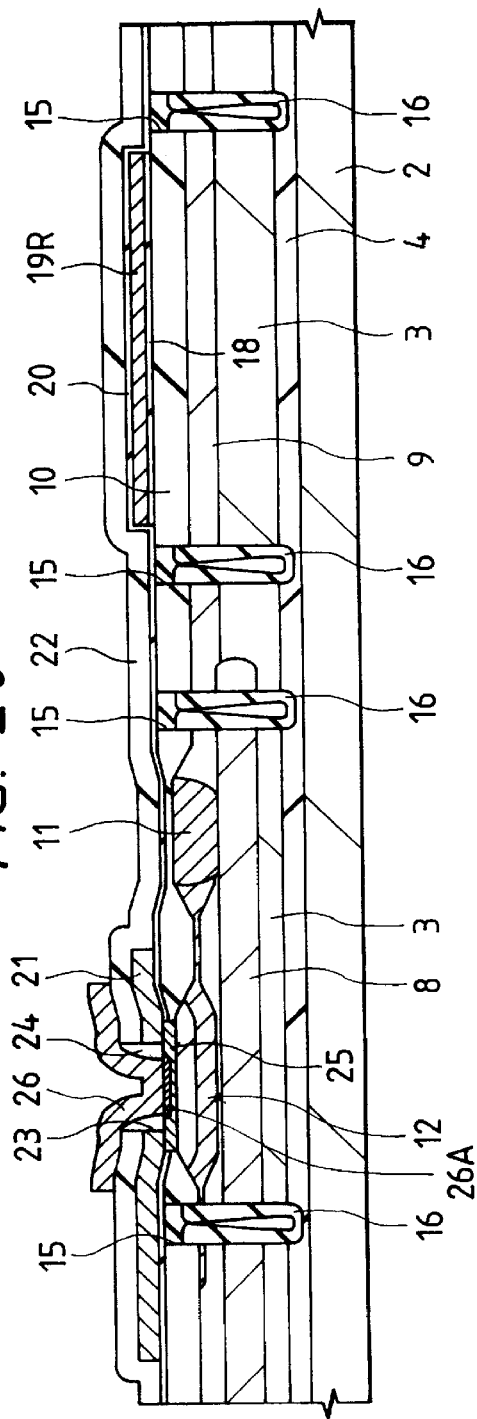

Then, as shown in FIG. 20, the n-polycrystal silicon film is patterned, and an emitter leading electrode 26 is formed on the base layer 25. The amorphous silicon film is formed by the method described above by using a gas mixture of Si$_2$H$_6$ and PPH$_3$ as a starting material gas and at a temperature of 510° C.

Then, as shown in FIG. 21, a BPSG (Boron-Doped Phosphosilicate Glass) 28 film is deposited to a thickness of about 1 $\mu$m by a CVD process. Then, rapid thermal annealing at 900° C. for 10 sec is conducted to activate various impurities doped in silicon. Then, a spin-on-glass film 29 is deposited to a thickness of about 300 nm by a rotary coating method, and the surface is flattened by etching back by about 800 nm.

Figure 22:
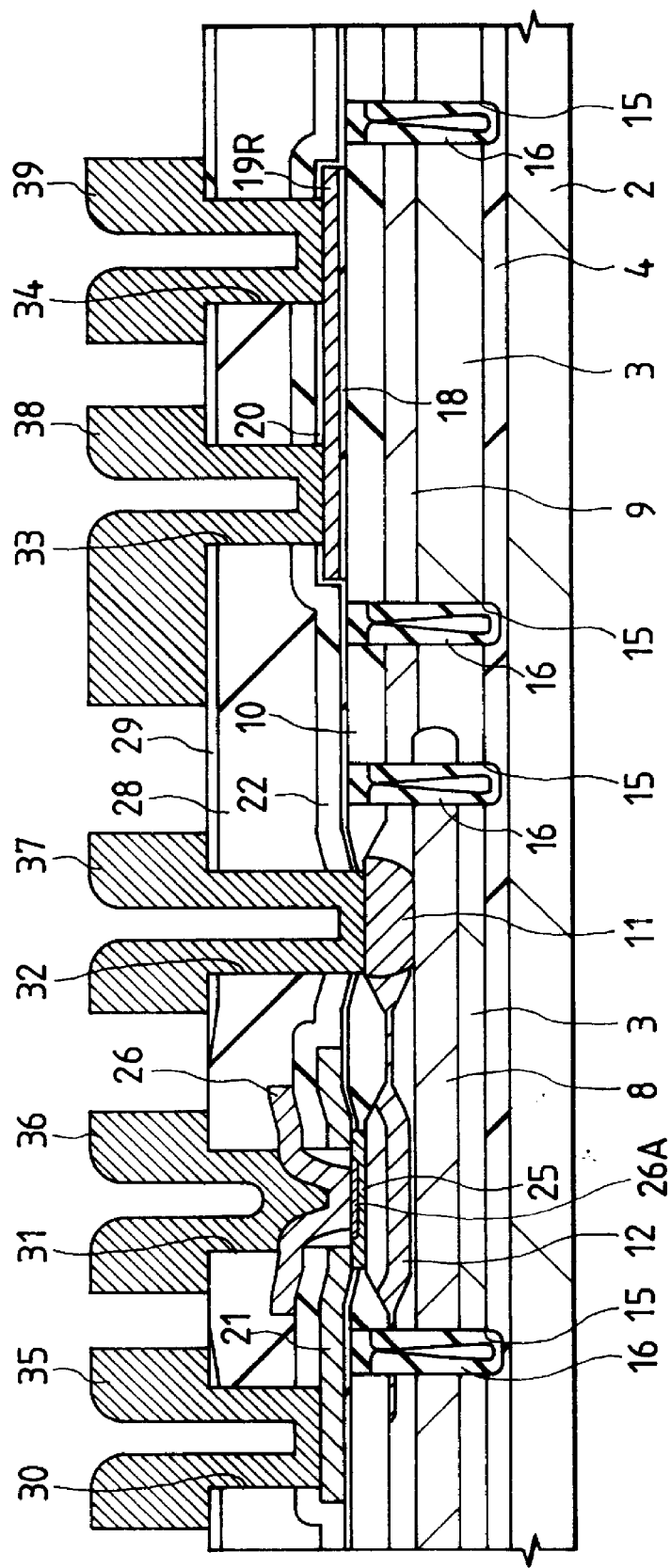
Figure 26:
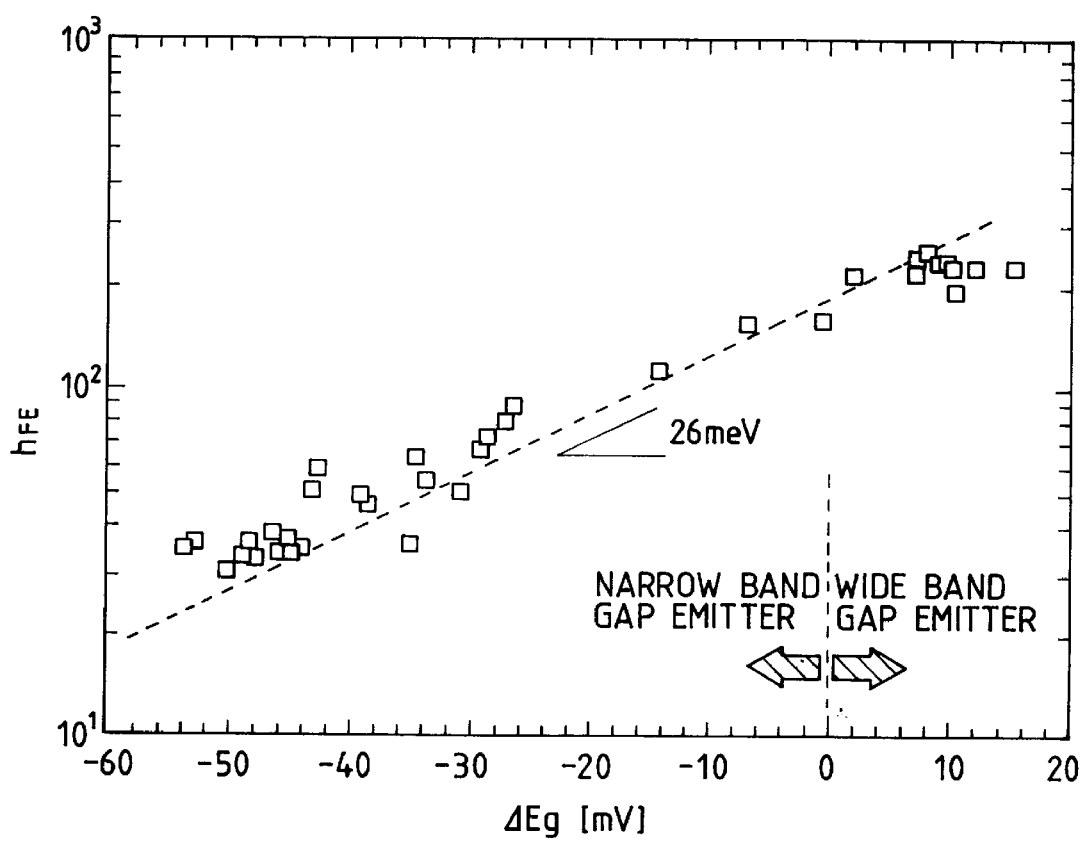
FIG. 26 is a graph illustrating a correlationship between a current amplification factor and an emitter-base band gap difference of bipolar transistors.
Figure 28A:
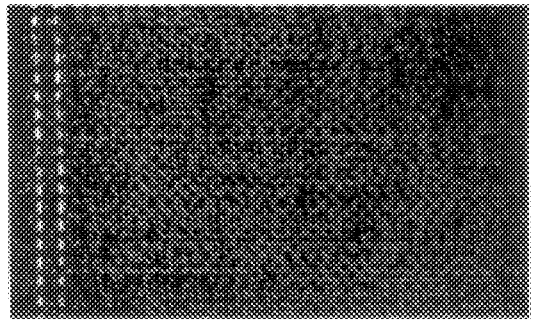
FIG. 28(a) is a photograph showing crystal grains on a silicon substrate.
Figure 28B:
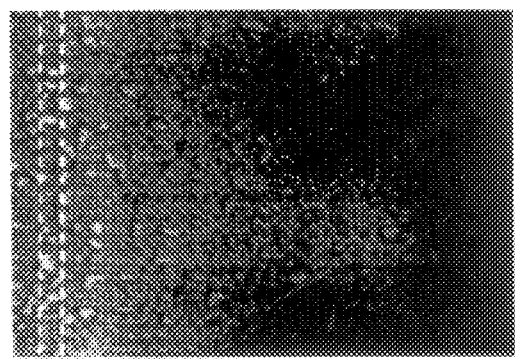
FIG. 28(b) is a photograph showing crystal grains on a thermally oxidized film and (c) is a photograph showing crystal grains on a chemical oxide film of about 1.2 nm thick.
Figure 28C:
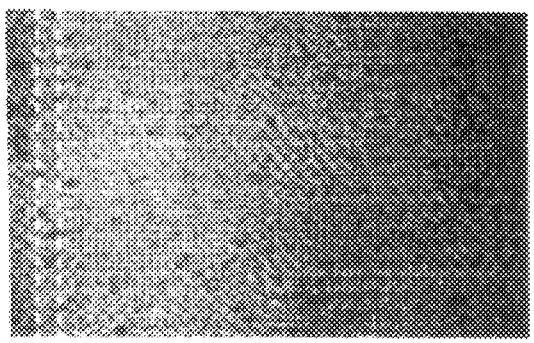
Figure 29:
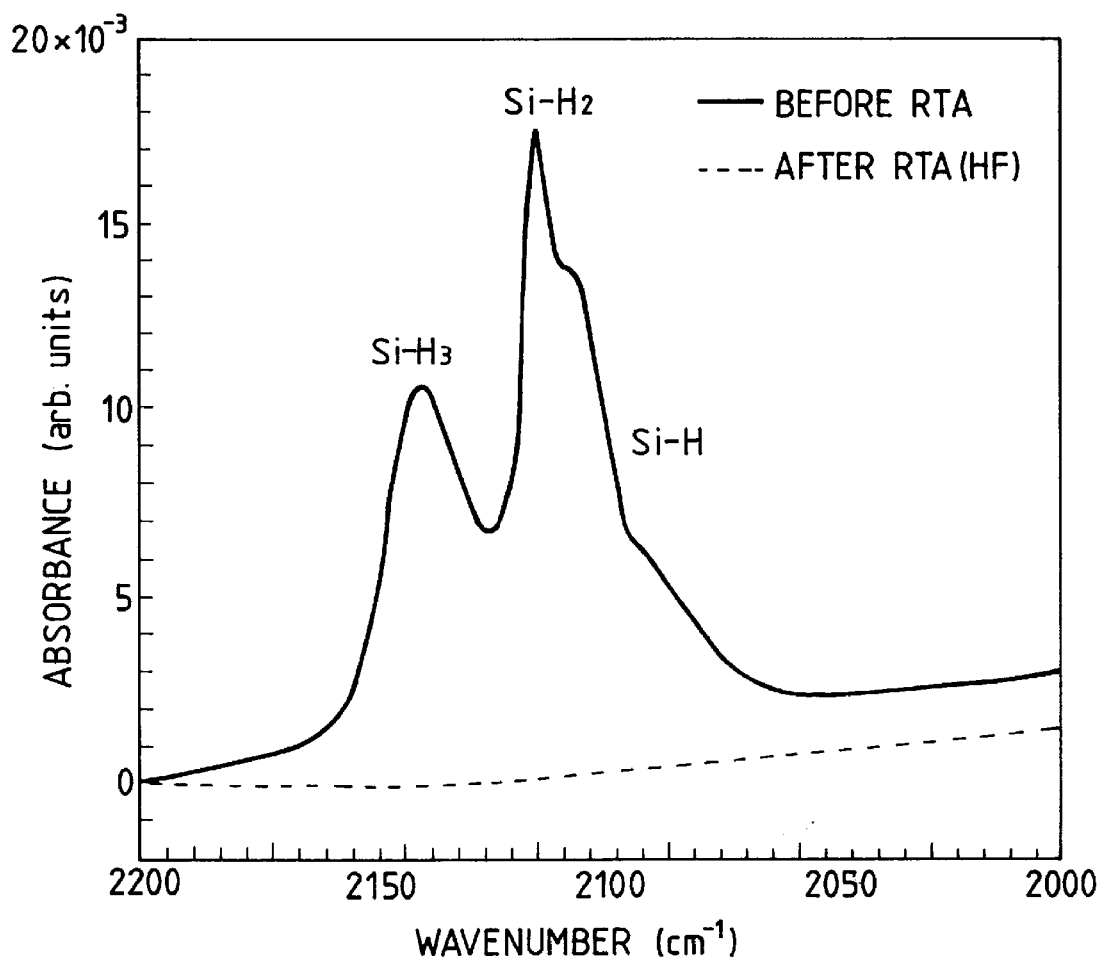
FIG. 29 is a graph showing the result of measurement by a Fourier IR spectrometry (FEIR), for Si—H intensity on the surface of a silicon substrate before and after the heat treatment.
Figure 30:
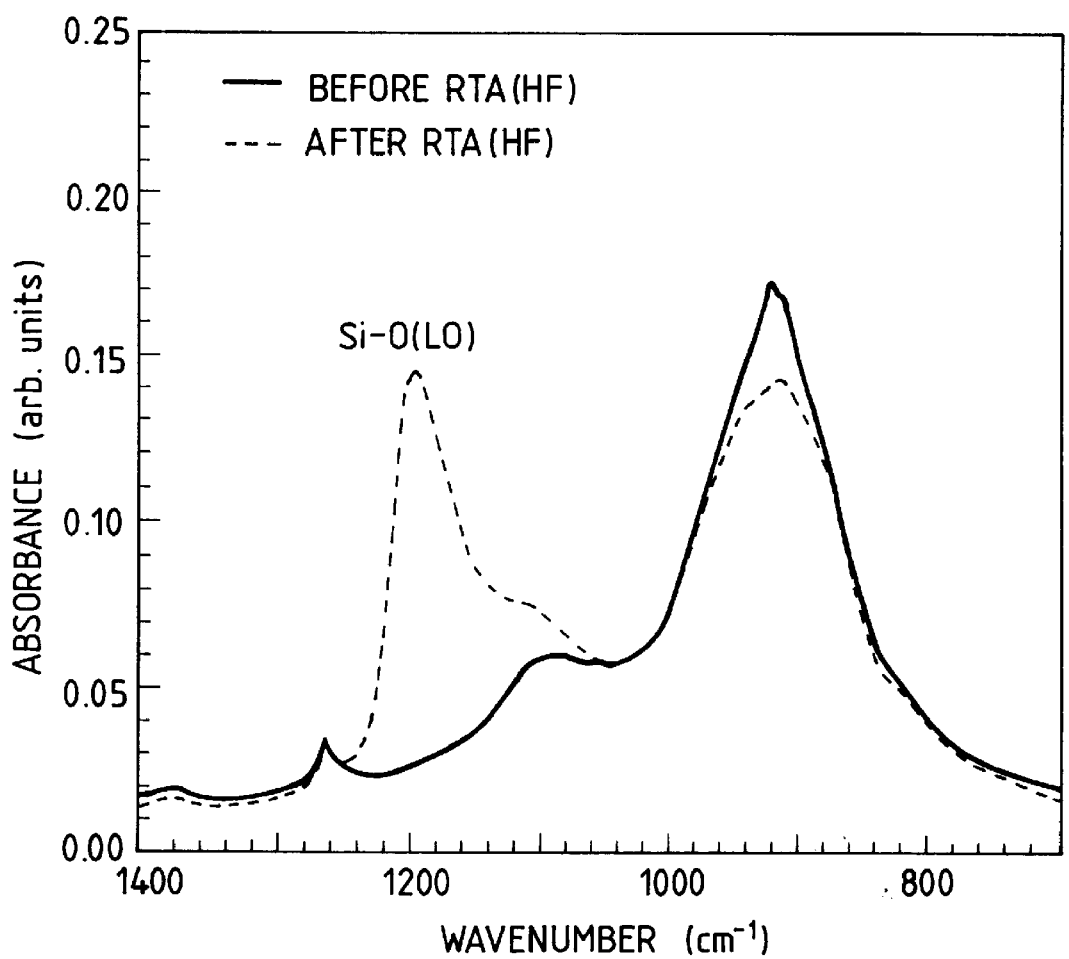
FIG. 30 is a graph showing the result of measurement by a Fourier IR spectrometry (FEIR) for Si—O intensity on the surface of a silicon substrate before and after the heat treatment measured.
Figure 31:
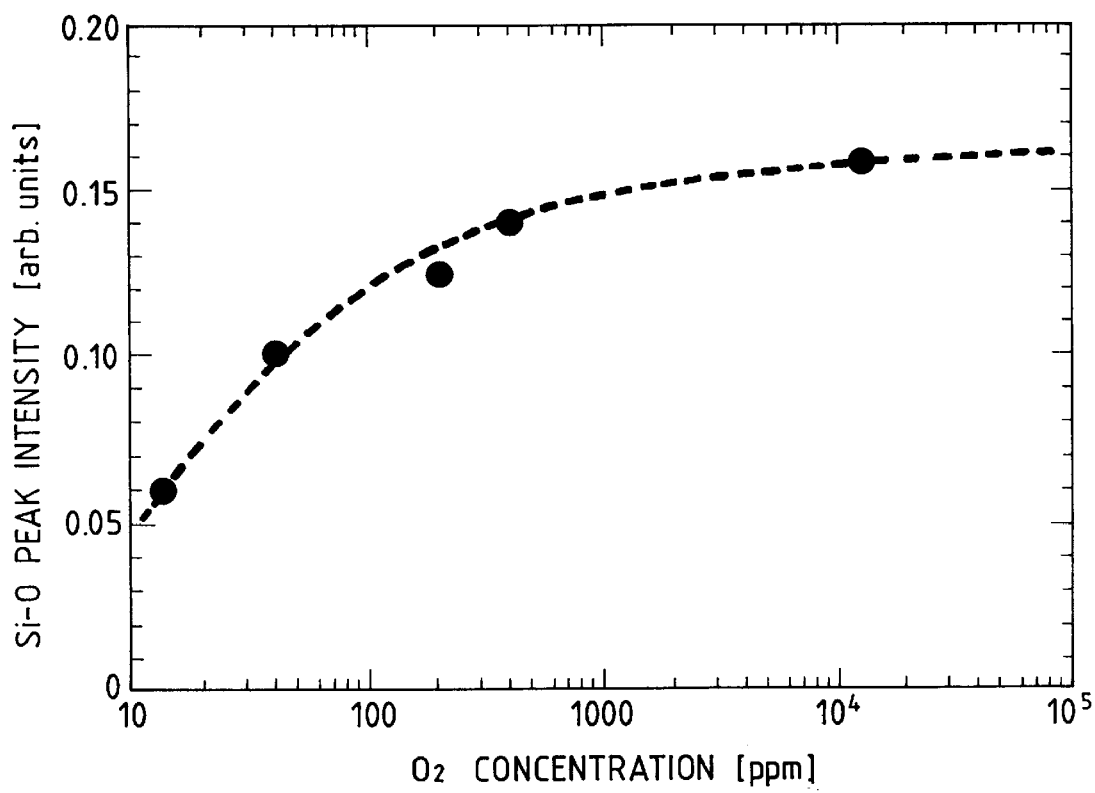
FIG. 31 is a graph showing dependence of Si—O intensity on the surface of a silicon substrate on oxygen concentration in $N_2$ annealing furnace measured by a Fourier IR spectrometry (FEIR)
Figure 32:
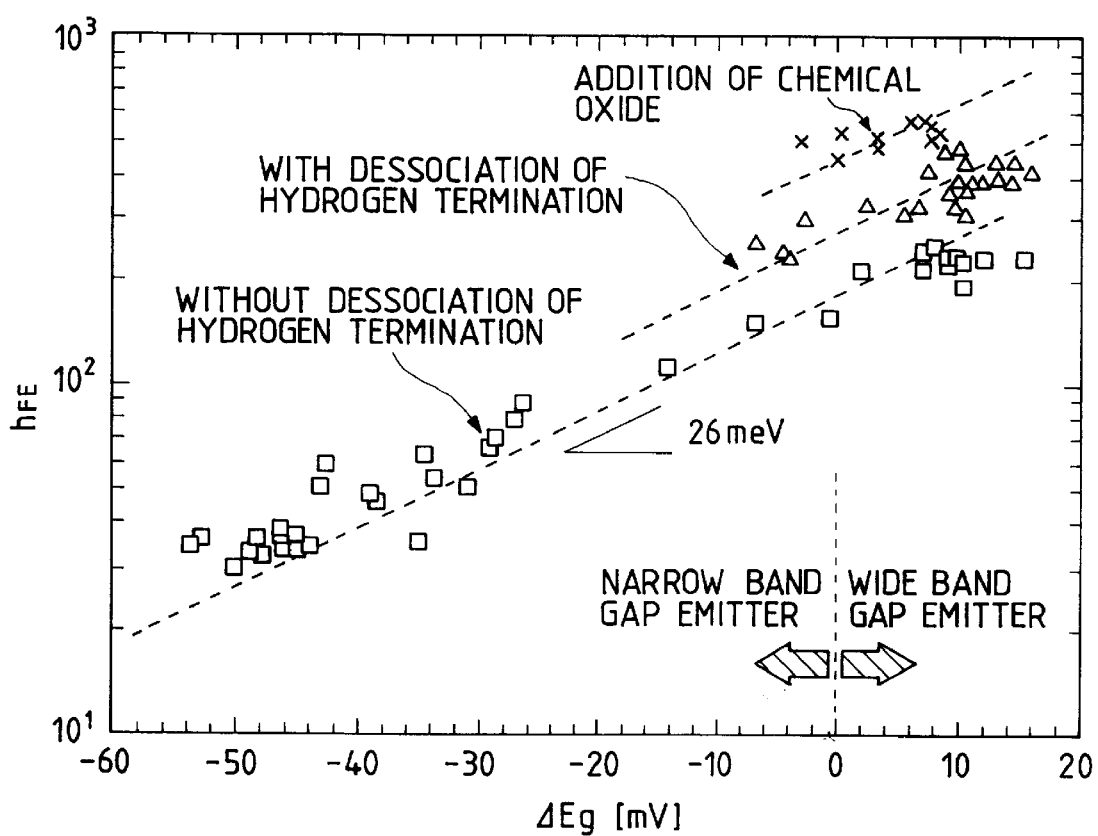
FIG. 32 is a graph showing a correlationship between a current amplification factor and a band gap difference by dissociation of hydrogen terminations.
Figure 33:
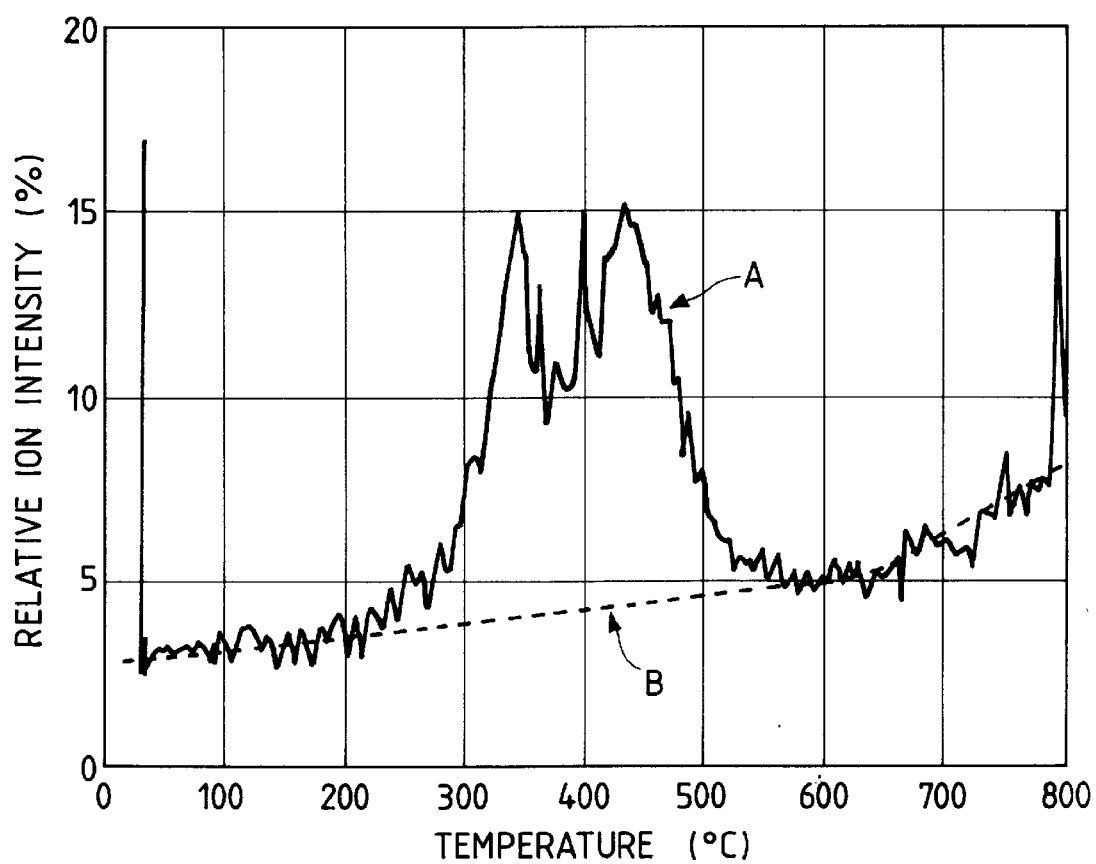
FIG. 33 is a graph showing temperature dependence of the dissociation amount of hydrogen terminations.

Then, as shown in FIG. 22, the BPSG film 28 and the spin-on-glass film 29 are etched to form a connection hole 30 reaching the base leading electrode 21, a connection hole 31 reaching the emitter electrode 26, a connection hole 32 reaching the collector leading electrode 11 and connection holes 33, 34 reaching the resistor element 19R are formed, respectively, and a metal film such as of an Al alloy deposited on the spinon-glass film 29 is patterned to form wirings 35~39. The bipolar transistor is substantially completed by the steps described above.

EXAMPLE 2

In the manufacturing method in Example 1, when the silicon oxide film 20 exposed to the bottom of the aperture portion 23 is wet-etched, a side wall spacer formed on the side wall of stepped portion in the region other than the aperture portion 23 (for example, stepped portion formed with the resistor element 19R) may be peeled off occasionally. In order to avoid this problem, the surface of the substrate is flattened before the silicon oxide film 20 is wet-etched.

At first, as shown in FIG. 23, a base leading electrode 21 is formed in the same manner as in Example 1. Then, as shown in FIG. 24, after depositing a silicon oxide film 22 of about 300 nm thick by a CVD process, a spin-on-glass film 40 of about 300 nm thick is rotationally coated on the silicon oxide film 22 and, successively, the spin-on-glass film 40 and the silicon oxide film 22 are etched back by about 400 nm in total, to flatten the surface of the substrate.

Then, as shown in FIG. 25, the spin-on-glass film 40, the silicon oxide film 22, and the base leading electrode 21 are etched to form an aperture portion 41, and a side wall spacer 42 comprising a silicon nitride film is formed to the side wall thereof. Subsequent steps are the same as those in Example 1.

According to this embodiment, since stepped portions are eliminated in the region other than the aperture portion 41 by flattening the surface of the substrate prior to the step of wet-etching the silicon oxide film 20 exposed to the bottom of the aperture portion 23, side wall spacer is not formed in the region other than the aperture portion 41 when the side wall spacer 42 is formed on the side wall of the aperture portion 41. Accordingly, there is no problem for the occurrence of obstacles due to peeling of the side wall spacer.

The present invention has been described specifically with reference to preferred embodiments but it should be understood that the present invention is not restricted to the embodiments but can be modified variously within a scope not departing the spirit thereof.

In the previous embodiments, the SOI substrate is used, but the present invention is applicable also to a manufacturing process for a bipolar transistor which uses a usual silicon substrate.

Further, the present invention of forming the emitter leading electrode after elimination of hydrogen terminations is applicable also to a manufacturing process of bipolar transistor of forming an intrinsic base region without applying epitaxial technique.

Advantageous effects obtainable by typical inventions among those disclosed in the present application are briefly explained below.

According to the present invention, since a substantially complete amorphous silicon film can be deposited by eliminating hydrogen and OH group terminations before forming the emitter leading electrode and amorphous silicon in (111) orientation can be grown on the silicon crystal substrate of (100) orientation, it is possible to make reduction of leak current and insurance of current multiplication factor compatible.

According to the present invention, it is possible to make reduction of leak current and improvement of emitter withstand voltage compatible by forming the buffer layer at a low impurity concentration to the surface of the intrinsic base layer.

According to the present invention, since the potential for the occurrence of obstacles in the manufacturing steps can be reduced, the bipolar transistors of high operation speed and high performance can be manufactured at an improved yield.

What is claimed is:

1. A method of manufacturing a semiconductor integrated circuit device having bipolar transistors comprising the steps of:

(a) providing a substrate having a main surface of silicon whose crystal orientation is (100);

(b) wet cleaning an emitter-forming region of the main surface of the substrate;

(c) after the step (b), applying a first heat treatment to the substrate;

(d) after the step (c), forming an amorphous silicon film containing impurities of a first conductivity type on the main surface of the substrate including the emitter-forming region by chemical vapor deposition; and (e) after the step (d), applying a second heat treatment to the substrate to diffuse the impurities of the first conductivity type in the amorphous silicon film into the main surface of the substrate and to crystallize the amorphous silicon film, thereby forming a first conductivity type emitter region and forming a polycrystalline silicon film whose crystal grains have a (111) orientation on the first conductivity type emitter region.

2. A method according to claim 1, wherein the temperature for the first heat treatment is 550° C. to 650° C.

3. A method according to claim 1, wherein the amorphous silicon film is deposited by chemical vapor deposition at a temperature lower than 540° C.

4. A method according to claim 1, wherein the temperature of the second heat treatment is from 750° C. to 900° C.

5. A method according to claim 1, wherein the first heat treatment eliminates hydrogen and OH-group terminations on the emitter-forming region of the main surface of the substrate.

6. A method according to claim 1, wherein the emitter-forming region includes an exposed buffer layer and a base layer beneath the buffer layer.

7. A method according to claim 6, wherein the emitter-forming region is framed by sidewall spacers.

8. A method according to claim 1, wherein the first heat treatment eliminates hydrogen and OH-group terminations on the emitter-forming region so as to provide the emitter-forming region in a state of exposing dangling bonds.

9. A method of manufacturing a semiconductor integrated circuit device having bipolar transistors, comprising the steps of:

(a) providing a semiconductor substrate having a main surface of silicon whose crystal orientation is (100);

(b) wet cleaning an emitter-forming region of the main surface of silicon;

(c) after the step (b), subjecting the semiconductor substrate to a first heat treatment, thereby eliminating hydrogen and OH-group terminations on the emitter-forming region of the main surface of silicon;

(d) after the step (c), forming an amorphous silicon film including impurities on the emitter-forming region of the main surface of silicon by chemical vapor deposition; and (e) after the step (d), subjecting the semiconductor substrate to a second heat treatment to diffuse the impurities into the emitter-forming region of the main surface of silicon and the crystallize the amorphous silicon film, to form an emitter region in the emitter-forming region of the main surface of silicon and a polycrystalline silicon film, whose grains are oriented to (111) direction, on the emitter region.

10. A method according to claim 9, wherein the amorphous silicon film is formed in the step (d), after the step (c), without forming a silicon oxide film on the emitter-forming region.

* * * * *